US008132222B2

(12) United States Patent
Phillips et al.

(10) Patent No.: US 8,132,222 B2
(45) Date of Patent: Mar. 6, 2012

(54) ADDRESSABLE TAP UNITS FOR CABLE TELEVISION NETWORKS AND RELATED METHODS OF REMOTELY CONTROLLING BANDWIDTH ALLOCATION IN SUCH NETWORKS

(75) Inventors: Neil P. Phillips, Dove Canyon, CA (US); Sou-Pen Su, Atlanta, GA (US); Tseng Min Chi, Taiwan (TW)

(73) Assignee: CommScope, Inc. of North Carolina, Hickory, NC (US)

( * ) Notice: Subject to any disclaimer, the term of this patent is extended or adjusted under 35 U.S.C. 154(b) by 877 days.

(21) Appl. No.: 11/943,244

(22) Filed: Nov. 20, 2007

(65) Prior Publication Data

US 2009/0133095 A1 May 21, 2009

(51) Int. Cl.
*H04N 7/173* (2006.01)
*H04N 7/16* (2006.01)
(52) U.S. Cl. .................................... 725/127; 725/149
(58) Field of Classification Search .................. None
See application file for complete search history.

(56) References Cited

U.S. PATENT DOCUMENTS

| | | | | |
|---|---|---|---|---|
| 4,598,312 | A | * | 7/1986 | Geissler et al. ................. 725/31 |
| 4,783,846 | A | * | 11/1988 | Wachob ....................... 455/151.4 |
| 4,982,440 | A | * | 1/1991 | Dufresne et al. .............. 725/125 |
| 5,058,198 | A | | 10/1991 | Rocci et al. |
| 5,142,574 | A | * | 8/1992 | West et al. ...................... 380/209 |
| 5,555,015 | A | * | 9/1996 | Aguayo et al. ................. 725/123 |
| 5,818,931 | A | * | 10/1998 | Movassaghi .................. 379/445 |
| 5,854,703 | A | * | 12/1998 | West, Jr. ........................ 398/66 |
| 6,006,066 | A | * | 12/1999 | Krimmel ....................... 725/125 |
| 6,049,693 | A | * | 4/2000 | Baran et al. ................... 725/124 |
| 6,081,169 | A | | 6/2000 | Romerein et al. |

(Continued)

FOREIGN PATENT DOCUMENTS

DE 29813567 U1 11/1998

(Continued)

OTHER PUBLICATIONS

Invitation to Pay Additional Fees and, Where Applicable, Protest Fee (6 pages) corresponding to International Application No. PCT/US2008/012803; Mailing date: Jul. 17, 2009.

(Continued)

*Primary Examiner* — Mark D Featherstone
(74) *Attorney, Agent, or Firm* — Myers Bigel Sibley & Sajovec

(57) ABSTRACT

Addressable tap units for a cable television network include a radio frequency input and a radio frequency output. These tap units may further include a radio frequency receiver that is configured to receive a radio frequency signal input at the radio frequency input. A filter circuit, which may be a plug-in filter circuit, is coupled between the radio frequency input and the radio frequency output. The filter circuit includes at least one filter that filters out signals in one or more frequency bands. The tap units also may include a plurality of switches that select one of a plurality of signal paths through the filter circuit. The plurality of switches may be controlled in response to data contained in the radio frequency signal. The tap unit may also include an alternate radio frequency path that bypasses the plug-in filter module so that signals incident at the radio frequency input traverse the alternate radio frequency path if the plug-in filter module is not installed in the addressable tap unit.

22 Claims, 17 Drawing Sheets

U.S. PATENT DOCUMENTS

| | | | | |
|---|---|---|---|---|
| 6,088,569 | A * | 7/2000 | Bach et al. | 725/149 |
| 6,751,803 | B1 * | 6/2004 | Matsuura | 725/127 |
| 6,757,522 | B1 | 6/2004 | Naegeli et al. | |
| 6,772,437 | B1 | 8/2004 | Cooper et al. | |
| 6,785,292 | B1 | 8/2004 | Vogel | |
| 2002/0109560 | A1 | 8/2002 | Loeffelholz et al. | |
| 2002/0144292 | A1 | 10/2002 | Uemura et al. | |
| 2004/0139476 | A1 * | 7/2004 | Bacon et al. | 725/120 |
| 2004/0221318 | A1 * | 11/2004 | Chang et al. | 725/127 |
| 2006/0015921 | A1 * | 1/2006 | Vaughan | 725/127 |

FOREIGN PATENT DOCUMENTS

| | | |
|---|---|---|
| GB | 2382473 A | 5/2003 |
| GB | 2254759 A | 9/2006 |
| GB | 2423904 A | 9/2006 |
| NL | 1007810 C | 3/1998 |

OTHER PUBLICATIONS

International Search Report corresponding to International Application No. PCT/US2008/012803; Mailing date: Sep. 15, 2009.
Technical Bulletin, "Technetix," PLU:FGTC12491, 2007 (admitted prior art).
Technical Bulletin, "Lindsay Broadband Inc. Addressable Multi-Tap" (admitted prior art).
Technical Bulletin, "Electroline," *ULTIMA Series Addressable Tap*, www.electroline.com;en/products/addressable/ultima/index.html, Nov. 16, 2007 (admitted prior art).
Technical Bulletin, "Addressable Multimedia Stretch™ Tap," Scientific Atlanta, 1999 (admitted prior art).
Technical Bulletin, AGT3000 Series Addressable Multitap, www.antronix.net/Products/agt.php?page=addressable, Nov. 16, 2007 (admitted prior art).
Technical Bulletin, "Addressable Multi-Tap Unit," Sentinel Series, www.blondertongue.com (admitted prior art).

\* cited by examiner

ADDRESSABLE TAP UNITS FOR CABLE TELEVISION NETWORKS AND RELATED METHODS OF REMOTELY CONTROLLING BANDWIDTH ALLOCATION IN SUCH NETWORKS

FIELD OF THE INVENTION

The present invention generally relates to cable communications systems and, more particularly, to bandwidth allocation for cable television networks.

BACKGROUND

Cable television networks refer to communications networks that are used to transmit cable television signals and/or other information between one or more service providers and a plurality of subscribers over cable and/or fiber. Most conventional cable television networks comprise hybrid fiber-coaxial networks. In these networks, fiber optic cables are typically used to carry signals from the headend facilities of the service provider to various distribution points, while less expensive coaxial cable may be used, for example, to carry the signals into neighborhoods and/or into individual homes. However, it will also be understood that the cable television network may comprise a completely fiber optic network or a completely coaxial cable network as well.

Typically, the service provider is a cable television company that may have exclusive rights to offer cable television services in a particular geographic area. The subscribers in a cable television network may include, for example, individual homes, apartments, hotels and other multi-dwelling units, and various businesses and other entities. The service provider may broadcast a broad variety of cable television channels to subscribers over the cable television network. The cable television network may provide more channels, and often provide better signal quality, than "broadcast" television signals that may be received via the open airways.

The cable television service provider may offer subscribers a variety of different services. By way of example, typically several "tiers" of cable television service will be offered, ranging from, for example, a "basic" service that might include, for example about a dozen channels, to full service offerings that might include as many as several hundred channels. Premium movie and sports channels are often made available for a separate monthly subscription fee, and subscribers may also be able to order special packages of sporting or other events on a "pay-per-view" basis. Many cable television service providers also now often offer other services such as, for example, movies-on-demand which allow a customer to download a movie for viewing during a fixed time period or services completely unrelated to television including, for example, broadband Internet service and digital telephone service.

Consumers now typically can choose from multiple service providers that offer television, Internet and telephone services. In addition, as noted above, often subscribers can choose from a range of service plans that provide varying levels of service at different price points. As a result of these range of choices, cable television network subscribers may fairly frequently add or drop service and/or change the service plan to which they subscribe. Each time this occurs, it may be necessary to configure the cable television network to provide the selected services to the subscriber in question.

A "tap" refers to a connection to a communications line. In cable television networks, a tap is connected to a cable of the network in order to provide a port that carries signals between the network and a particular subscriber's premise (e.g., a house, apartment, business, etc.). Typically, a tap unit that includes multiple taps (e.g., eight) is connected in series to the network cable, and each tap includes an output port that may be connected to a subscriber premise (i.e., a cable that runs from the output port into the subscriber's premise). Thus, one tap unit may be used to provide a plurality of subscribers (e.g., eight) access to the cable network. An "addressable tap" is a tap that may be turned on or off from a remote location. An "addressable tap unit" is a tap unit that includes at least one addressable tap. Using addressable taps, a cable television service provider may activate or deactivate service to a particular subscriber from a remote location.

SUMMARY

Pursuant to embodiments of the present invention, addressable tap units for cable television networks are provided that include a radio frequency input that connects to the cable television network and a radio frequency output that connects to a first subscriber premise. These addressable tap units further include a radio frequency receiver that is configured to receive a radio frequency signal input at the radio frequency input. The addressable tap units also have a filter circuit coupled between the radio frequency input and the radio frequency output that includes a plurality of signal paths. A first filter is provided on a first of these signal paths that filters out signals in one or more frequency bands. A plurality of switches are included that select one of the plurality of signal paths through the filter circuit. The plurality of switches are controlled in response to data contained in the radio frequency signal.

In some embodiments, the filter circuit may further include a second filter that is on a second of the plurality of signal paths, and a third of the plurality of signal paths may bypass both the first and second filters. In such embodiments, the first filter may be a high pass filter and the second filter may be a band pass filter. The addressable tap unit may also include a microprocessor that receives an output of the radio frequency receiver. The microprocessor may be configured to generate a plurality of control signals that control the settings of at least some of the plurality of switches based at least in part on the received data contained in the radio frequency signal. In some embodiments, the filter circuit may be a plug-in filter circuit that is removably coupled to the addressable tap unit. In such embodiments, the addressable tap may include an alternate radio frequency signal path that bypasses the filter circuit, and the addressable tap unit may be configured so that signals incident at the radio frequency input traverse the alternate radio frequency path if the plug-in filter circuit is not installed in the addressable tap unit.

Pursuant to further embodiments of the present invention, addressable tap units are provided that include a radio frequency input and a radio frequency output that is coupled to a first subscriber premise (e.g., a house, apartment, business, etc.). These addressable tap units further include a plug-in filter circuit that is coupled between the radio frequency input and the radio frequency output and include a plurality of switches that select one of a plurality of signal paths through the plug-in filter circuit. An alternate radio frequency path that bypasses the plug-in filter circuit is also provided. The addressable tap unit is configured so that signals incident at the radio frequency input traverse the alternate radio frequency path if the plug-in filter circuit is not installed in the addressable tap unit.

Pursuant to still further embodiments of the present invention, methods of selectively controlling the communications bandwidth between a cable television network and a subscriber premise are provided in which a command is forwarded from a control computer to an addressable tap unit over the cable television network. The command includes information regarding how to set at least one switch in a filter circuit of the addressable unit in order to route communications through a different one of a plurality of radio frequency signal paths that are included in the filter circuit. These methods may also involve receiving and demodulating the command, generating a control signal based on the demodulated command, and reconfiguring the setting of a switch in a filter circuit of the addressable tap unit in response to the control signal in order to route communications through the different one of the plurality of radio frequency signal paths that are included in the filter circuit.

Pursuant to still further embodiments of the present invention, methods of identifying upstream noise sources in a cable television network are provided in which a baseline noise level in the network is measured. Then, a control signal is sent to an addressable tap unit that is connected to the cable television network, the control signal including a command for the addressable tap unit to reduce the upstream bandwidth between the cable television network and a first port on the addressable tap unit. Then, a noise level in the network is measured after the upstream bandwidth between the cable television network and the first port on the addressable tap unit has been reduced.

Pursuant to still further embodiments of the present invention, addressable tap units are provided that include a control signal receiver that is configured to receive a plurality of filter selection control signals for the addressable tap unit from the cable television network, a filter circuit that includes a plurality of filters, a respective one of which is configured to selectively attenuate a respective portion of a cable television network band, and a switching unit that is configured to select different subsets of the plurality of filters in response to the receipt of one of the plurality of filter selection control signals from the cable television network.

BRIEF DESCRIPTION OF THE DRAWINGS

FIGS. 12A-12E are "screen shots" of various user interface screens that are presented to operators in certain control software according to embodiments of the present invention.

DETAILED DESCRIPTION

Figure 1:
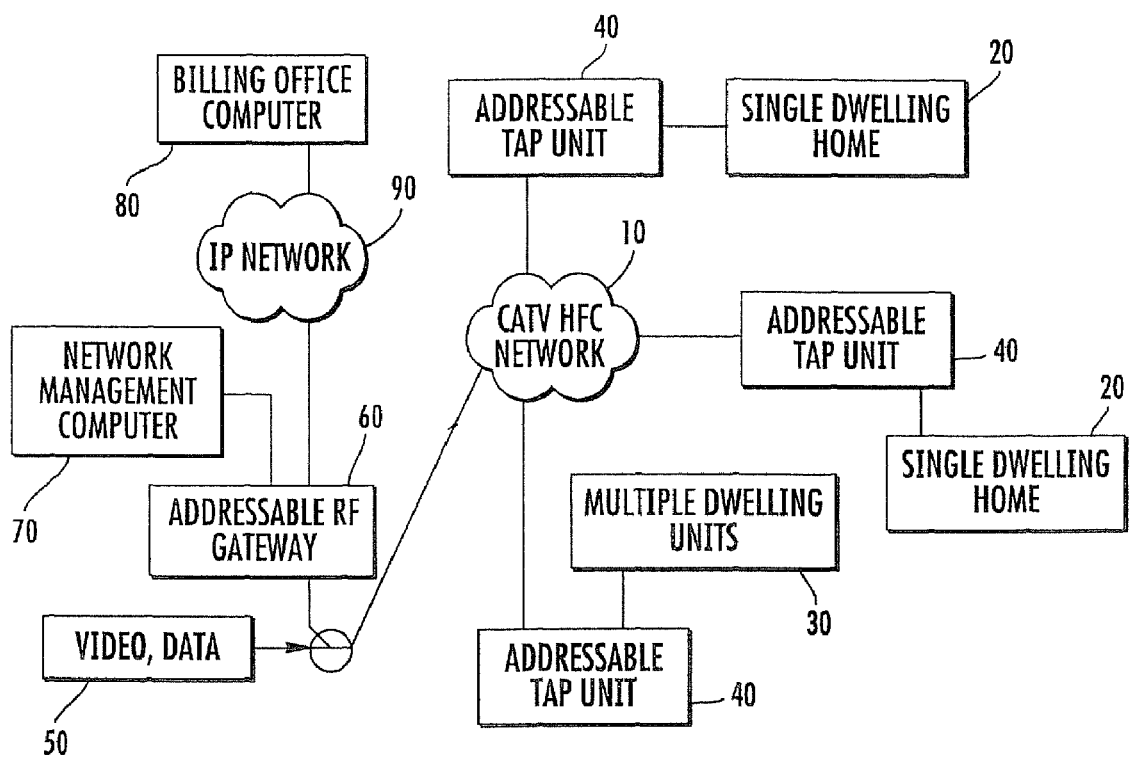
FIG. 1 is a block diagram illustrating an environment in which addressable tap units according to embodiments of the present invention may be used.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element to another element as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, operations, elements and/or components, but do not preclude the presence or addition of one or more other features, operations, elements, components and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Pursuant to embodiments of the present invention, addressable tap units are provided that allow a cable network operator/service provider to, from a remote location, control which signals are passed in the downstream and/or the upstream direction between the cable service provider and the premises of customers that subscribe/purchase services from the cable service provider (herein "subscribers"). Consequently, a cable service provider may use the addressable tap units according to embodiments of the present invention to add, drop and/or change the services provided to a particular subscriber premise without the need to send a service technician to the subscriber site. Thus, the addressable tap units according to embodiments of the present invention may facilitate reducing cable service provider operating expenses associated with subscriber disconnects, reconnects and service changes. A centrally located system controller may be used to make changes in the services provided to individual subscribers and/or groups of subscribers. In some embodiments, the centrally located system controller may be integrated with the cable service provider's billing system.

The addressable tap units according to certain embodiments of the present invention include filter circuits that may be used to select specific frequency bands in which signals will or will not be allowed to pass between the service provider and individual subscriber premise. By customizing the passband of the addressable tap units to more closely match the frequency bands on which individual subscribers receive services, it may be possible to reduce or minimize noise funneling in the return path. In addition, the addressable tap units according to embodiments of the present invention may be used to track noise in the cable network. Moreover, the addressable tap units may include non-interruptible contacts so that they may work with or without the filter circuit (which, in some embodiments may comprise a plug-in filter module) that allows for selective bandwidth control. Accordingly, the addressable tap units can initially be deployed without filter modules to reduce initial costs, and the plug-in filter modules may be added as needed later.

In some embodiments of the present invention, addressable tap units are provided that allow the cable service provider to remotely control the cable television and other signals that are transmitted between the service provider and a subscriber premise in the 5 MHz to the 1000 MHz frequency band. Typically, "downstream" signals from the cable service provider to subscribers are transmitted in the 51-1000 MHz frequency band. These downstream signals may include, for example, the different tiers of cable television channels, movies on demand, digital telephone and/or Internet service (the signals received by the subscriber), and other broadcast or point-to-point offerings. Typically, the "upstream" signals from subscribers to the cable service provider are transmitted in the 5-40 MHz frequency band. These upstream signals may include, for example, digital telephone and/or Internet service (the signals transmitted by the subscriber) and ordering commands (i.e., for movies-on-demand and other services). The addressable tap units according to embodiments of the present invention may allow the cable service provider to remotely "control" the bandwidth allocated to the subscriber in question by setting the addressable tap (or taps) in the unit to one of a plurality of states. By way of example, in one specific embodiment, each addressable tap may be set to one of four different states:

1. "ON" mode—Passes the full downstream frequency band (typically from 51-1000 MHz) from the cable service provider to the subscriber premise, and passes the full upstream frequency band (typically from 5-40 MHz) from the subscriber premise to the cable service provider.
2. "OFF" mode—Does not pass any signals between the cable service provider and the subscriber premise in either the upstream or the downstream frequency bands.
3. "HIGH PASS" mode—Passes the full downstream frequency band from the cable service provider to the subscriber premise, while blocking the full upstream frequency band from the subscriber premise to the cable service provider.
4. "WINDOW" mode—Passes selected portions of the downstream frequency band from the cable service provider to the subscriber, and passes selected portions of the upstream frequency band from the subscriber to the cable service provider. The WINDOW mode may be used to pass frequencies associated with one or more specific tier(s) of services which an individual subscriber has ordered.

It will be appreciated that different cable service providers offer different services over different frequency bands. As such, the setting of the WINDOW mode may be customized for individual cable operators based on the services they offer and the frequency band allocation for those services. It will be appreciated that each addressable tap on an addressable tap unit may have fewer than, or more than, four different states. By way of example, several different WINDOW modes may be provided in some embodiments.

In many instances, particular subscribers will not utilize all of the services provided over the full bandwidth (typically 5-1000 MHz) of the cable television network. For example, some subscribers may only order cable television and digital telephone service from their cable service provider, while choosing not to subscribe to cable Internet service, movies on demand and other service options. These subscribers, therefore, may only need access to, for example, a small portion (e.g., 5 MHz) of the upstream frequency band. Using the addressable tap units according to embodiments of the present invention, the amount of bandwidth provided to individual subscribers may be remotely controlled, thereby making it easy and convenient to filter out frequency bands that are not being used by individual subscribers. This may allow cable service providers to more easily control the services that are made available to individual subscribers (so that such subscribers do not receive services that they are not paying for), and also allows the cable service provider to reduce the amount of noise introduced into the cable television network from individual subscriber locations.

The addressable tap units according to embodiments of the present invention may also allow cable service providers to reduce or eliminate the need for set top boxes. By way of example, in many current cable television networks, analog cable television signals are transmitted in the 52-550 MHz frequency band, while digital cable television signals are transmitted in the 550-860 MHz frequency band. By using the WINDOW mode feature of the addressable tap units according to embodiments of the present invention, a cable service provider can remotely control which signals are delivered to individual subscribers. Thus, the addressable tap units of the present invention may, in some situations, be used instead of set top boxes to control the services that are provided to individual subscribers.

FIG. 1 is a block diagram illustrating an environment in which addressable tap units 40 according to embodiments of the present invention may be used. As shown in FIG. 1, a cable television network such as cable television hybrid fiber-coax ("CATV HFC") network 10 provides cable television service and/or other services to a plurality of subscriber premises including, for example, single dwelling homes 20 and multiple dwelling units 30. A cable service provider provides video and/or data signals 50 that are carried over the cable television network 10 to the subscriber premises 20, 30. An addressable tap unit 40 is coupled between the cable television network 10 and each subscriber premise 20, 30. Typically, the addressable tap units 40 will be located outside, perhaps within an enclosure, near the subscriber premises 20, 30 (i.e., on the outside of a building, in a cable box near the street, etc.).

As is further shown in FIG. 1, a gateway 60 receives commands from, for example, a control computer, and converts the commands into a signal that is sent to one or more of the addressable tap units 40. The commands may be generated by control software running on the control computer. In one exemplary embodiment of the present invention, the gateway 60 is an addressable radio frequency gateway that includes a radio frequency frequency-shift-keying ("FSK") transmitter that converts the commands (which may be received, for example, over an RS-232 serial data connection or over an Ethernet connection) into a radio frequency FSK carrier that may be addressed and sent to one or more of the addressable tap units 40 over the cable television network 10. In some embodiments of the present invention, the control computer may be a computer 80 located at a centralized location such as the billing office of the cable service provider, and may be connected to the gateway 60 over, for example, an Internet protocol ("IP") network 90. In other embodiments, the control computer may be a network manager computer 70 that is located at the gateway 60 or at a remote location and in communication with the gateway 60 over an IP network 90 or other communication link.

The control software that runs on the control computer 70 or 80 may include a graphical user interface that allows an operator to readily input changes in the services that are being provided to a subscriber. The control software may automatically generate the above-discussed commands that are forwarded to the gateway 60 and then sent to the addressable tap units 40 in response to the input of this information. Thus, in some embodiments of the present invention, the updating of a subscriber's service profile by an operator may automatically result in reconfiguration of an addressable tap so as to change the actual services provided to the subscriber. The cable service provider billing office may be a convenient place to locate the control software as the billing office typically receives information regarding all changes in service to individual subscribers, and the addressable taps on the addressable tap units 40 may thus be automatically reprogrammed each time a change in service is received at the billing office and entered into the computer system. The addressable tap system thus may include the addressable tap units 40, the gateway 60 and the control software which may be used on an existing network 10, with existing subscribers and with an existing control computer 70, 80.

Figure 2:
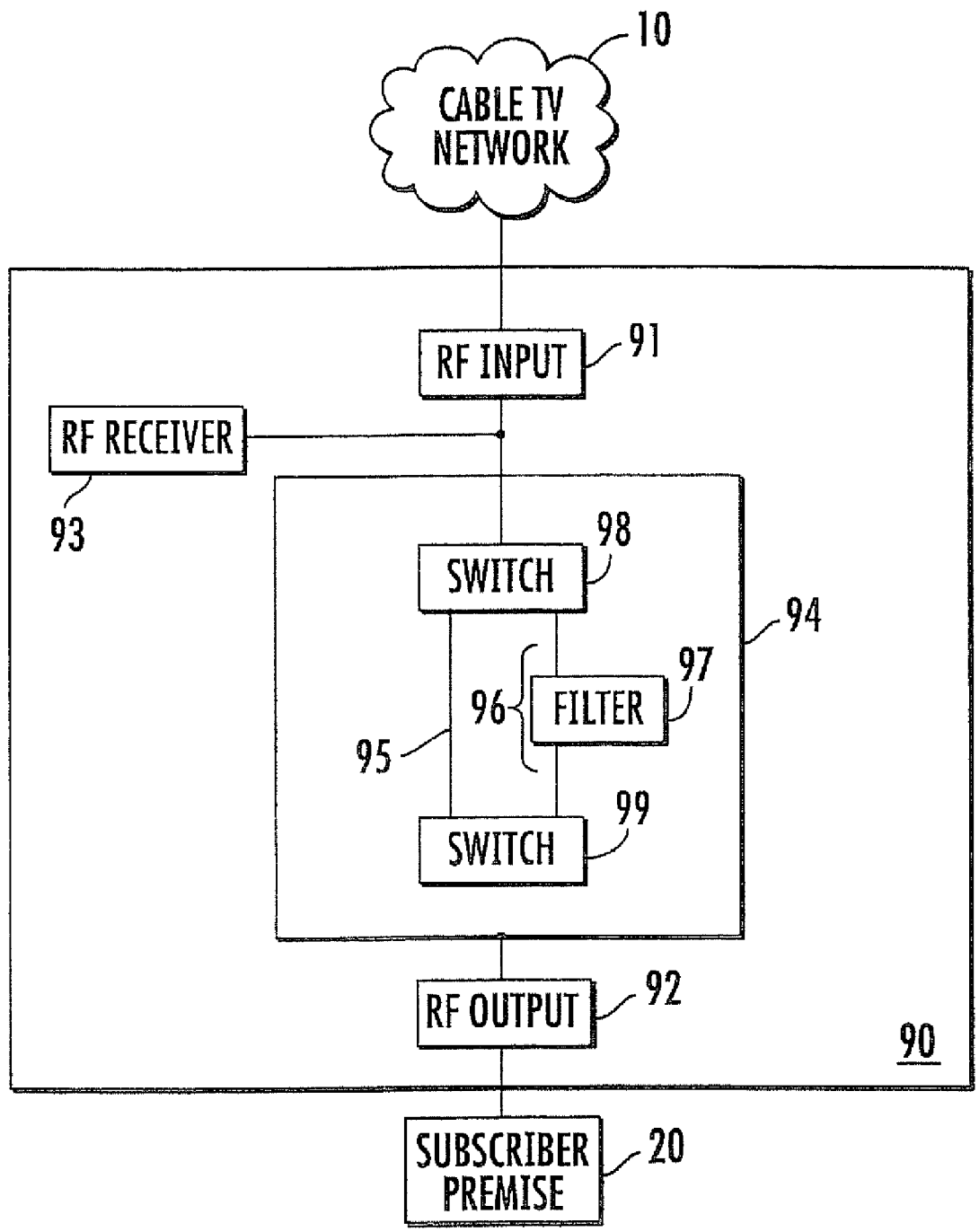
FIG. 2 is a block diagram of an addressable tap unit according to certain embodiments of the present invention.

FIG. 2 is a block diagram of an addressable tap unit 90 according to certain embodiments of the present invention. The addressable tap unit 90 may be used as the addressable tap units 40 depicted in FIG. 1. As shown in FIG. 2, the addressable tap unit 90 includes a radio frequency ("RF") input 91 that is configured to connect to a cable television network 10 and a radio frequency output 92 that is coupled to a first subscriber premise 20. The addressable tap unit 90 further includes a radio frequency receiver 93 that is configured to receive a radio frequency signal input at the radio frequency input 91. The addressable tap unit 90 also includes a filter circuit 94 that is coupled between the radio frequency input 91 and the radio frequency output 92. The filter circuit 94 includes at least two signal paths 95, 96. A filter 97 that filters out signals in one or more frequency bands is provided on at least one of the signal paths (here signal path 96). In addition, the addressable tap unit 90 includes a plurality of switches 98, 99 that select one of the plurality of signal paths 95, 96 through the filter circuit 94. The switches 98, 99 may be part of the filter circuit 94 or may be separate circuits. The switches 98, 99 are controlled in response to data contained in the radio frequency signal that is input at the radio frequency input 91. While the addressable tap unit 90 is shown as including a single addressable tap, it will be appreciated that in many situations multiple addressable taps will be included within a single addressable tap unit 90.

Figure 3:
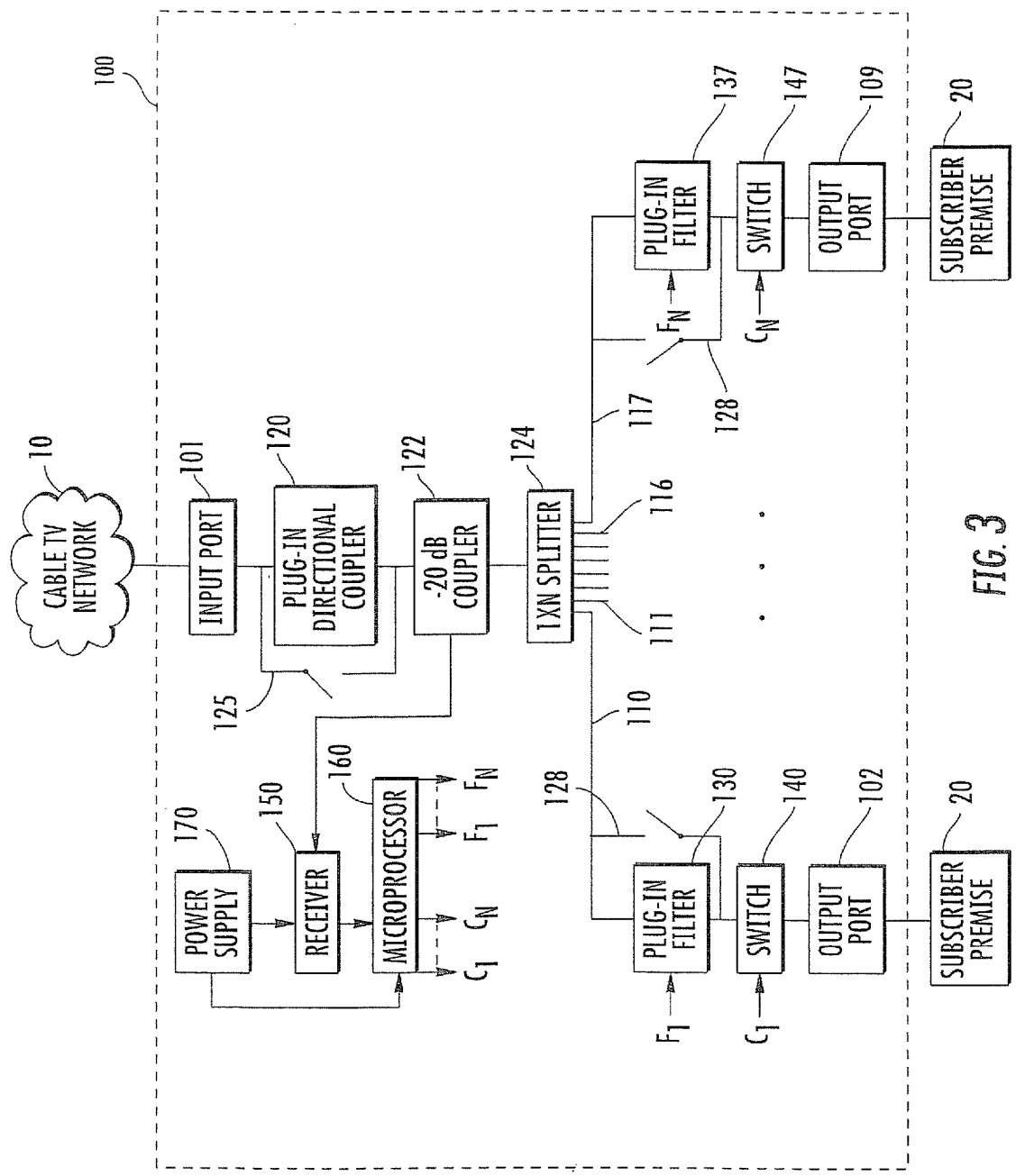
FIG. 3 is a block diagram of an addressable tap unit according to further embodiments of the present invention.

FIG. 3 is a block diagram of an addressable tap unit 100 according to further embodiments of the present invention. The addressable tap unit 100 may be used as the addressable tap units 40 depicted in FIG. 1. As shown in FIG. 3, the addressable tap unit 100 includes an input port 101 that couples cable television and/or data signals between the addressable tap unit 100 and the cable television network 10, a plurality of output ports 102-109 (only output ports 102 and 109 are depicted in FIG. 3) that couple cable television and/or data signals between each addressable tap on addressable tap unit 100 and respective subscriber premises 20, and a plurality of radio frequency signal paths 110-117 that connect input port 101 to the respective output ports 102-109. Each radio frequency signal path 110-117 in the particular embodiment depicted in FIG. 3 traverses a shared directional coupler 120 (which may be a plug-in directional coupler), a shared −20 dB (or other) coupler 122 and a shared 1×N radio frequency splitter 124. Each radio frequency signal path 110-117 further includes its own plug-in filter circuits 130-137 and its own switch 140-147 (only filter circuits 130 and 137 and switches 140 and 147 are depicted in FIG. 3). In the embodiment of FIG. 3, the addressable tap unit 100 includes eight addressable taps and eight output ports, so the 1×N radio frequency splitter 124 may be implemented as a 1×8 splitter. It will be appreciated, however, that in other embodiments the addressable tap unit 100 may include different numbers of addressable taps and output ports and be modified accordingly. It will also be understood that various of the components of FIG. 3 may be omitted or replaced with other components.

As is also shown in FIG. 3, the addressable tap unit 100 further includes a power supply 170, a receiver 150 and a microprocessor 160. The receiver 150 may comprise, for example, a radio frequency FSK receiver 150 having demodulation capabilities. Command signals received from the cable television network 10 are coupled to the FSK receiver 150 via the coupler 122. The FSK receiver 150 may receive and demodulate these command signals and provide the demodulated command signals to the microprocessor 160. The command signals may include data that is used by the microprocessor (which may be a microcontroller) 160 to determine how a plurality of switches included in each plug-in filter circuit 130-137 should be set. The command signals may also include data that is used by the microprocessor 160 to determine how each of the switches 140-147 should be set. In response to a received and demodulated command signal, the microprocessor 160 may set a plurality of control signals $C_1$-$C_N$ and $F_1$-$F_N$ that are used to control the setting of the switches 140-147 and the plurality of switches (not pictured in FIG. 3) that are included in (or associated with) each plug-in filter circuit 130-137.

As noted above, filter circuits 130-137 may comprise "plug-in" filter circuits. By "plug-in" it is meant that the filter circuits 130-137 are configured to be field installable and/or field removable by inserting the filter circuit 130-137 into a mating slot, recess, housing and/or other receptacle. Such "plug-in" filter circuits 130-137 further include electrical contacts that mate with corresponding electrical contacts in the filter slot, recess, housing and/or other receptacle. As such, a technician may readily install and/or replace these plug-in filter circuits 130-137 in the field simply by pulling out any filter circuit that is to be replaced and plugging a new filter circuit 130-137 into the filter slot, recess, housing and/or other receptacle. It will be appreciated that one or more retainment mechanisms such as snap latches, clips, screws or the like may be included that ensure that the filter circuit 130-137 remains firmly in place after it is plugged in. Such retainment mechanisms may need to be disengaged or removed in order to remove one plug-in filter circuit and replace it with another plug-in filter circuit. It will also be appreciated that in some embodiments of the present invention the filter circuit is not a plug-in filter circuit.

As is also shown in FIG. 3, the addressable tap unit 100 includes a "non-interruptible" directional coupler contact 125 and a plurality of "non-interruptible" plug-in filter contacts 128. The non-interruptible directional coupler contact 125 maintains a radio frequency path through the addressable tap unit 100 even if the plug-in directional coupler 120 is not installed or is temporarily removed to, for example, change the value of the plug-in directional coupler 120 or during maintenance operations. Thus, the non-interruptible directional coupler contact 125 allows the addressable tap unit 100 to provide downstream signals even when the plug-in directional coupler 120 is not installed in the addressable tap unit 100. Similarly, each of the plurality of non-interruptible plug-in filter contacts 128 allow the addressable taps on addressable tap unit 100 to maintain a radio frequency path through the addressable tap unit 100 even if a respective corresponding one of the plug-in filter circuits 130-137 is not inserted into the addressable tap unit 100. By way of example, the addressable tap unit 100 may initially be deployed without the plug-in filter circuits 130-137 in order to reduce the initial deployment costs. Thereafter, a technician may install the plug-in filter circuits 130-137. Insertion of each plug-in filter circuit 130-137 disables a respective one of the non-interruptible plug-in filter contacts 128. The non-interruptible plug-in filter contacts 128 may also simplify the installation process by eliminating the need to remove jumper connections. The contacts 125, 128 are referred to as "non-interruptible" contacts because these contacts are configured so that a significant (or, in some cases, even a noticeable) break will not occur in downstream service when the plug-in directional coupler 120 or the plug-in filter circuits 130-137 are plugged into, or removed from, the addressable tap unit 100.

As shown in FIG. 3, the non-interruptible directional coupler contact 125 provides an alternate signal carrying path that bypasses the plug-in directional coupler 120. In some embodiments of the present invention, the non-interruptible directional coupler contact 125 may be implemented as a signal carrying path that is mechanically open-circuited when a directional coupler 120 is plugged into the addressable tap unit 100. For example, in one specific embodiment, the non-interruptible directional coupler contact 125 may be implemented as a metal contact beam that is shaped to have good contact force and elastic "memory." When the non-interruptible metal contact beam 125 is "engaged" (which occurs when the plug-in directional coupler 120 is not installed in the addressable tap unit 100), the non-interruptible metal contact beam 125 makes mechanical and electrical contact between a radio frequency input point and a radio frequency output point to provide an alternate radio frequency path. In contrast, when plug-in directional coupler 120 is installed in the addressable tap unit 100, the directional coupler 120 mechanically moves the non-interruptible metal contact beam 125, thereby open-circuiting the alternate radio frequency path. The non-interruptible metal contact beam 125 is designed so that upon removal of the plug-in directional coupler 120 the non-interruptible metal contact beam 125 immediately re-establishes the alternate radio frequency path to ensure that no significant and/or noticeable break occurs in downstream service.

Similarly, the non-interruptible plug-in filter contacts 128 each provide an alternate signal carrying path that bypasses a respective one of the plug-in filter circuits 130-137. In some embodiments of the present invention, the non-interruptible plug-in filter contacts 128 may each be implemented as a signal carrying path that is mechanically open-circuited when a plug-in filter circuit 130-137 is plugged into the addressable tap unit 100. In some embodiments, the non-interruptible plug-in filter contacts 128 may be implemented using metal contact beams that are similar or identical to the metal contact beams discussed above that may be used to implement the non-interruptible directional coupler contact 125.

Figure 13A:
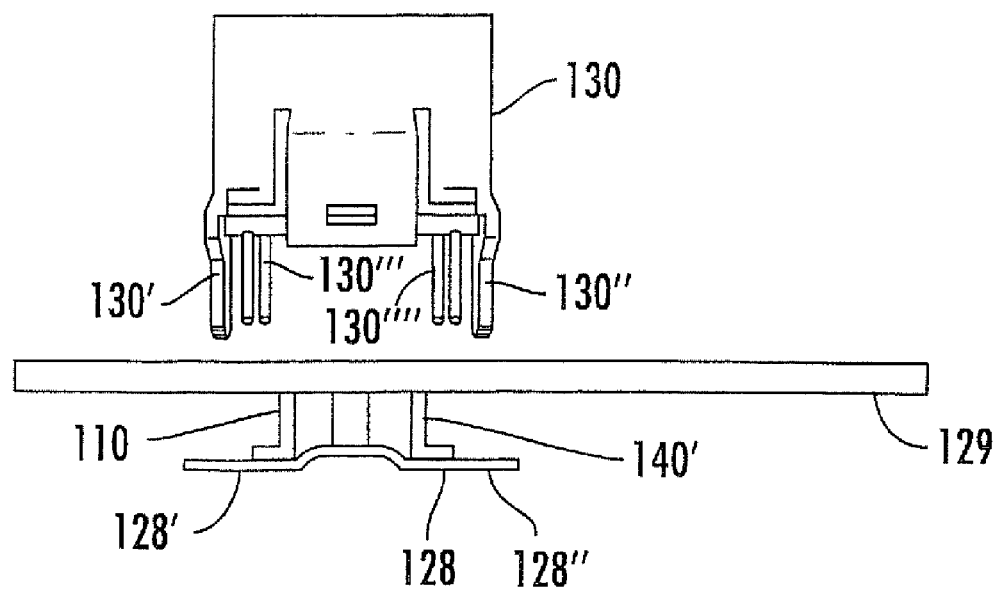
FIGS. 13A-13B are side views of a non-interruptible plug-in filter contact in engaged and disengaged positions, respectively, according to certain embodiments of the present invention.
Figure 13B:
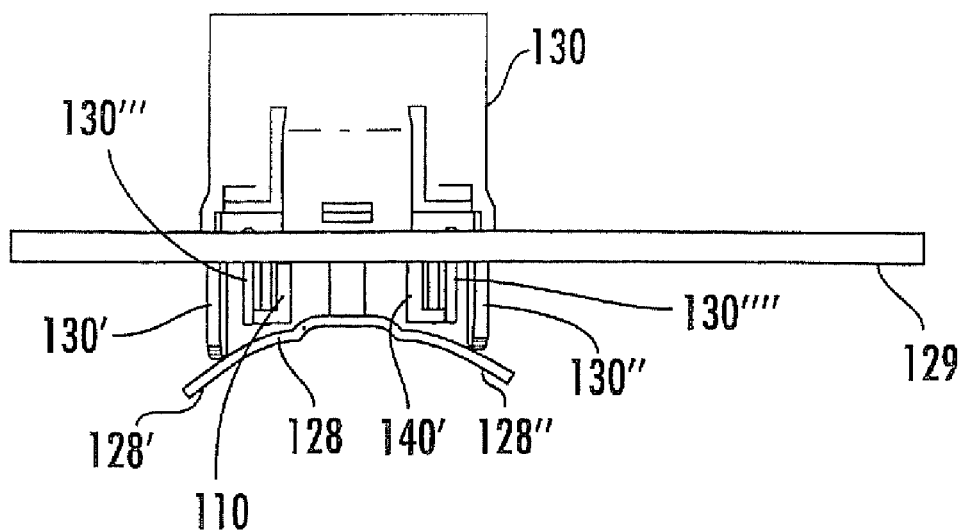

FIGS. 13A and 13B illustrate one implementation of the non-interruptible plug-in filter contact 128 according to embodiments of the present invention. As shown in FIGS. 13A-13B, the non-interruptible plug-in filter contact 128 comprises a flat, elongated piece of metal that has first and second ends 128', 128". As shown in FIG. 13A, in its engaged position, the first end 128' connects to output 110 of the 1×N splitter 124 (see FIG. 3) that extends from a printed circuit board 129. In this resting position, the second end 128" of non-interruptible plug-in filter contact 128 connects to an input 140' to CMOS switch 140 (see FIG. 3) that likewise extends from printed circuit board 129. As shown in FIG. 13A, in the engaged position, the non-interruptible plug-in filter contact 128 provides a radio frequency path that connects the output 110 of the 1×N splitter 124 to the input 140' of CMOS switch 140.

As is also shown in FIGS. 13A and 13B, the plug-in filter circuit 130 has first and second protrusions 130', 130" extending from a bottom surface thereof. As is shown in FIG. 13B, when the plug-in filter circuit 130 is inserted into the addressable tap unit 100, these protrusions 130', 130" pass through apertures in the printed circuit board 129 to contact the respective ends 128', 128" of the non-interruptible plug-in filter contact 128 and move the ends 128', 128" downwardly, thereby open-circuiting the radio frequency path that connects the output 110 of the 1×N splitter 124 to the input 140' of CMOS switch 140. As is also shown in FIG. 13B, when the plug-in filter circuit 130 is inserted into the addressable tap unit 100, a first contact protrusion 130''' on the plug-in filter circuit 130 passes through an aperture in the printed circuit board 129 to make electrical connection with the output 110 of the 1×N splitter 124 and a second contact 130'''' on the plug-in filter circuit 130 passes through a fourth aperture in the printed circuit board 129 to make electrical connection with the input 140' to CMOS switch 140. These first and second contacts 130''', 130'''' establish a radio frequency path between the output 110 of the 1×N splitter 124 and the input 140' of CMOS switch 140 that passes through the plug-in filter circuit 130. When the plug-in filter circuit 130 is removed, the resilient non-interruptible plug-in filter contact 128 springs back into its normal resting (engaged) position, thereby returning to the position depicted in FIG. 13A and re-establishing the radio frequency path through the non-interruptible plug-in filter contact 128 that connects the output 110 of the 1×N splitter 124 to the input 140' of CMOS switch 140.

The switches 140-147 are coupled between a respective one of the plug-in filter circuits 130-137 and its corresponding subscriber port 102-109. In some embodiments, the switches 140-147 may comprise CMOS switches. The switches 140-147 are provided so as to allow each addressable tap in addressable tap unit 100 to operate in the ON and OFF modes even if no plug-in filter circuit 130-137 is plugged into the device for a particular subscriber port, and so that the device may still operate in the ON and OFF modes if one or more of plug-in filter circuits 130-137 malfunctions. In particular, to provide for operation in the ON mode, the CMOS switch 140 will be set to provide a direct path between plug-in filter 130 and output port 102. In contrast, to provide for operation in the OFF mode, the CMOS switch 140 will be set to terminate the output of plug-in filter 130 to a 75 ohm termination, thereby disengaging subscriber premise 20 from the cable TV network 10.

Figure 4:
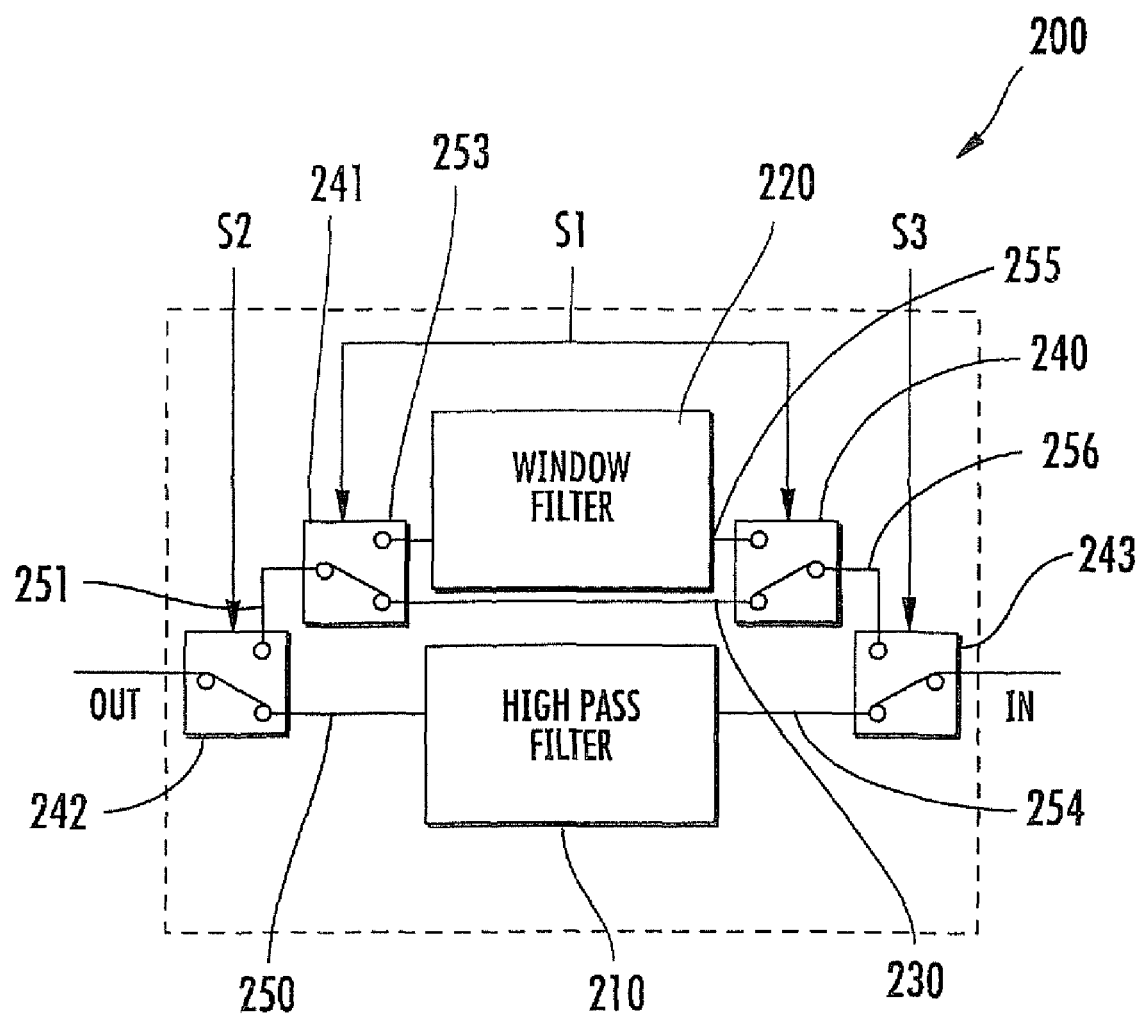
FIG. 4 is a block diagram of an embodiment of the plug-in filter circuits of FIG. 3.

FIG. 4 is a block diagram of one implementation of a plug-in filter circuit 200 according to embodiments of the present invention. Plug-in filter circuits 130-137 of FIG. 3 may, for example, be embodied as a plug-in filter circuit 200. As shown in FIG. 4, plug-in filter circuit 200 may include a high pass filter 210, a window filter 220, a filter free signal carrying path 230 and switches 240-243. The high pass filter 210 comprises a high pass filter that passes signals having a frequency above, for example, 50 MHz while attenuating lower frequency signals. The window filter 220 comprises a bandpass filter that passes signals in one or more selected frequency ranges within, for example, the 5-1000 MHz frequency band while attenuating signals in other frequency ranges. By way of example, the window filter 220 may be configured to pass signals in frequency bands that provide a subscriber with 911 digital telephone service and standard cable television service, while attenuating/blocking signals in all other frequency ranges and thus disabling other services such as normal digital telephone service, premium cable television service and pay-per-view and movies-on-demand services.

The switches 240-243 comprise two-position switches that are configured to open one of two possible signal paths and close the other signal path in response to a control signal that is applied to the switch. The switches 240-243 are controlled by control signals S1-S3 which are generated by, for example, the microprocessor 160. In the particular embodiment of FIG. 4, each of the control signals $F_1$-$F_N$ in the block diagram of FIG. 3 comprises three separate control signals, which are designated S1-S3 in FIG. 4. As shown in FIG. 4, control signal S1 controls switches 240 and 241, control signal S2 controls switch 242, and control signal S3 controls switch 243. It will also be appreciated that some or all of the plurality of switches 240-243 may be implemented as, for example, four position switches. For purposes of this disclosure, such switches that include more than two output positions are considered to be multiple switches.

In embodiments of the present invention that use plug-in filter circuit 200 to implement the filter circuits 130-137 in the addressable tap unit 100 of FIG. 3, each addressable tap may be set to one of four different modes (ON, OFF, HIGH PASS, WINDOW) by application of the control signals S1-S3 to switches 240-243. For example, an addressable tap may be set to the ON mode that is discussed above by setting control signal S2 so that switch 242 connects to path 251, setting control signal S1 so that switches 240 and 241 connect to the filter free signal carrying path 230, and setting control signal S3 so that switch 243 connects to path 256. In this manner, signals incident at the input of either switch 242 or switch 243 flow through the filter free signal carrying path 230, and hence all signals in the downstream and upstream frequency bands may be passed between the subscriber premise and the cable television service provider. It will be appreciated that other switch settings may also be used to implement the ON mode.

Similarly, in order to set one of the addressable taps in the addressable tap unit 100 of FIG. 3 to the OFF mode, control signal S2 is set so that switch 242 connects to path 251, while control signal S3 is set so that switch 243 connects to path 254. Switches 240 and 241 may be set to either position. In this manner, signals incident at the input of either switch 242 or switch 243 face an open circuit within the plug-in filter circuit 200. As such, when set to the OFF mode, no signals are passed between the subscriber and the cable television service provider. It will be appreciated that other switch settings may also be used to implement the OFF mode. For example, as discussed above, the CMOS switches 140-147 may be used to set the taps on the addressable tap unit 100 to the OFF mode.

In order to set one of the addressable taps in the addressable tap unit 100 of FIG. 3 to the HIGH PASS mode, control signal S2 is set so that switch 242 connects to path 250, while control signal S3 is set so that switch 243 connects to path 254. Switches 240 and 241 may be set to either position. In this manner, signals incident at the input of either switch 242 or switch 243 flow through signal paths 253 and 254 and the high pass filter 210. As discussed above, the high pass filter 210 only passes high frequency signals (e.g., signals at frequencies above 50 MHz) between the subscriber and the cable television service provider, thereby implementing the HIGH PASS mode of operation. It will be appreciated that other switch settings may also be used to implement the HIGH PASS mode.

In order to set one of the taps in addressable tap unit 100 to the WINDOW mode, control signal S2 is set so that switch 242 connects to path 251, control signal S1 is set so that switch 241 connects to path 253 and switch 240 connects to path 255, and control signal S3 is set so that switch 243 connects to path 256. In this manner, signals incident at the input of either switch 242 or switch 243 flow through signal paths 251, 253, 255 and 256 and the window filter 220. As discussed above, the window filter 220 only passes signals in selected frequency ranges within, for example, the 5-1000 MHz frequency band while attenuating signals in other frequency ranges, thereby implementing the WINDOW mode of operation. It will be appreciated that other switch settings may also be used to implement the WINDOW mode.

Figure 5:
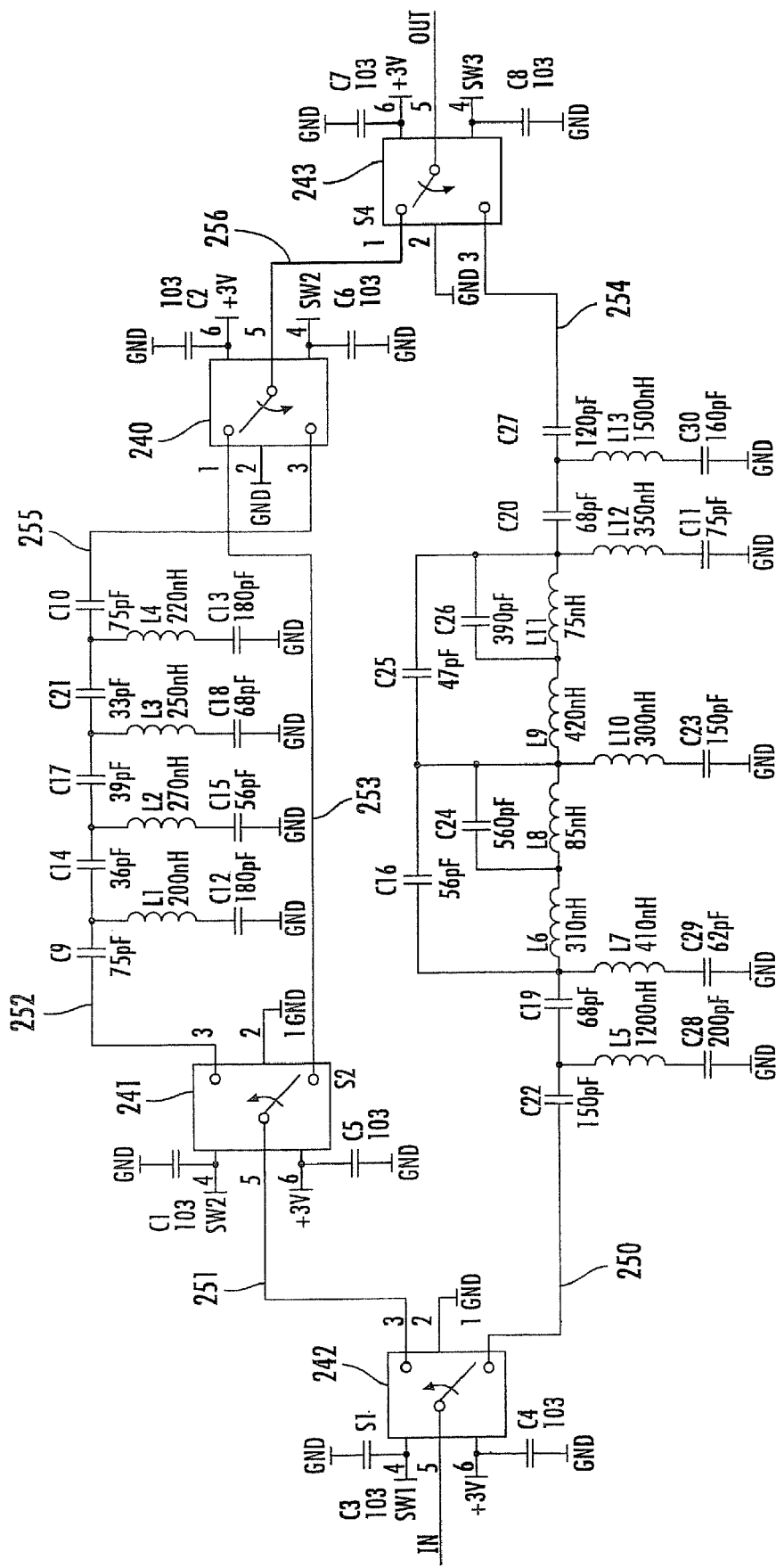
FIG. 5 is a circuit diagram of an embodiment of the plug-in filter circuit of FIG. 4.

FIG. 5 is a detailed circuit diagram of one embodiment of the plug-in filter circuit 200 of FIG. 4. FIG. 5 illustrates component values for the resistors, capacitors and inductors that comprise the high pass filter 210 and the window filter 220 according to certain embodiments of the present invention. The high pass filter 210 of FIG. 5 passes signals in a first frequency band, and has an isolation factor of approximately 30 dB with 6 MHz skirts. The window filter 220 of FIG. 5 pass signals in second and third frequency bands. The window filter 220 of FIG. 5 likewise has an isolation factor of approximately 30 dB with 6 MHz skirts.

Figure 6:
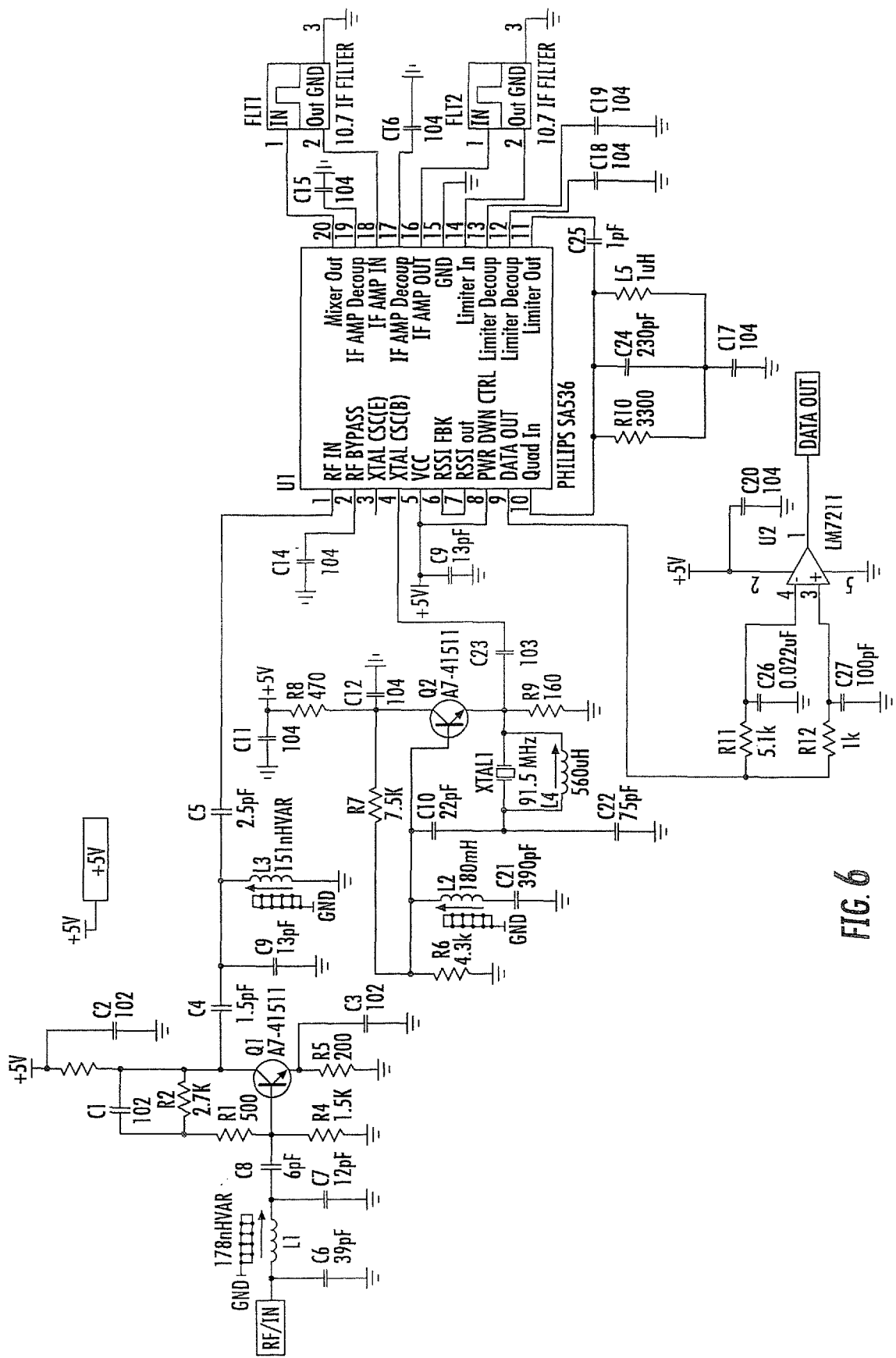
FIG. 6 is a circuit diagram of an embodiment of the radio frequency FSK receiver of FIG. 3.

FIG. 6 is a detailed circuit diagram of an embodiment of radio frequency FSK receiver 150 of FIG. 3. The FSK receiver 150 receives a radio frequency signal RF/IN from the cable television network. The received radio frequency signal is downconverted and demodulated to provide a baseband digital signal that is labeled DATA OUT in FIG. 6. As shown in FIG. 3, this baseband digital signal DATA OUT may be provided to the microprocessor 160. While the FSK receiver 150 of FIG. 6 represents a customized receiver design, it will be appreciated that a wide variety of standard of custom or receivers could be used. It will also be appreciated that the receiver need not be an FSK receiver.

Figure 7:
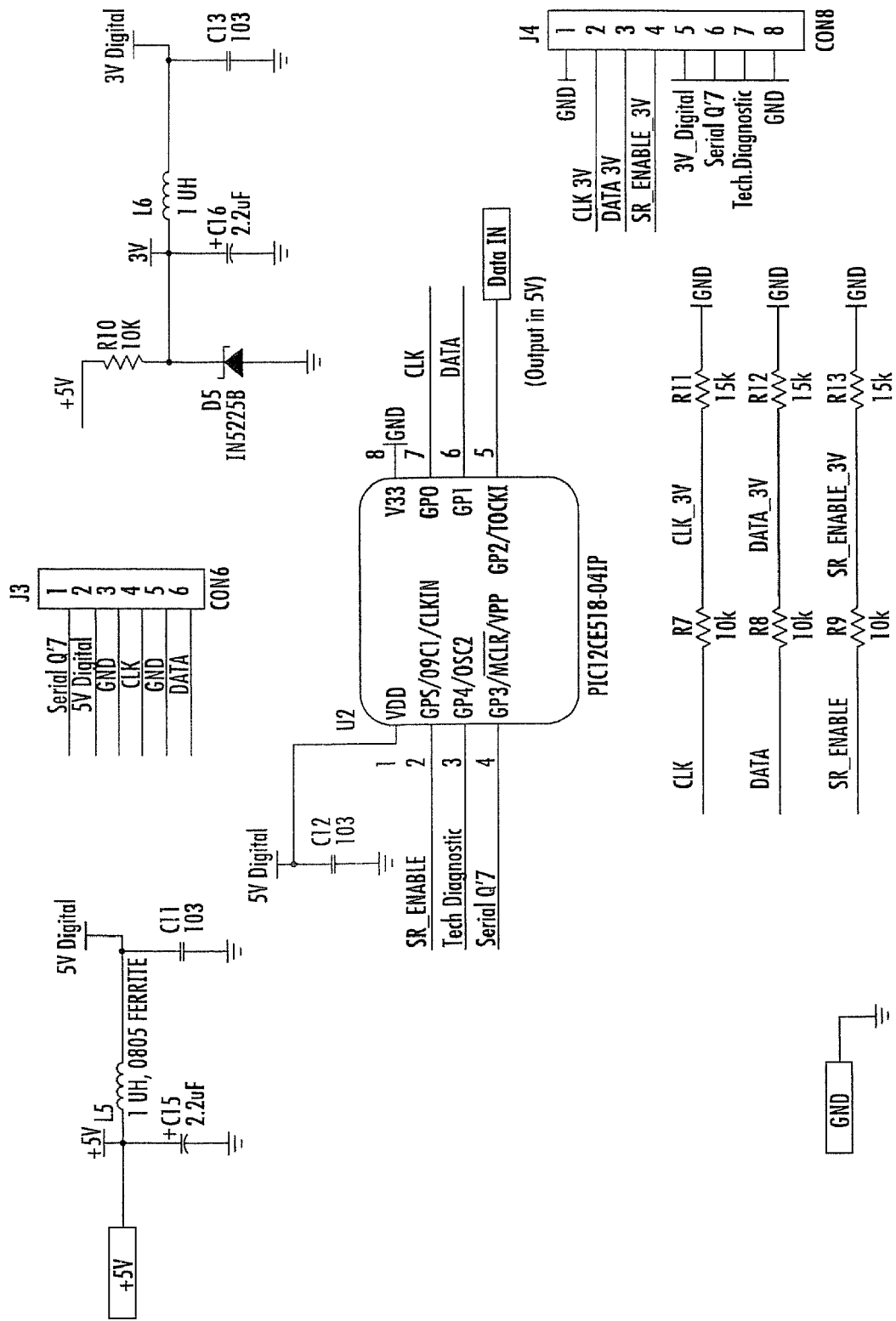
FIG. 7 is a schematic diagram of an embodiment of the microprocessor of FIG. 3.

FIG. 7 is a schematic diagram of an embodiment of the microprocessor 160 of FIG. 3. The microprocessor 160 includes conventional components that will be well understood by those of skill in the art. It will also be appreciated that numerous other microprocessors could be used in place of the microprocessor of FIG. 7.

Figure 8:
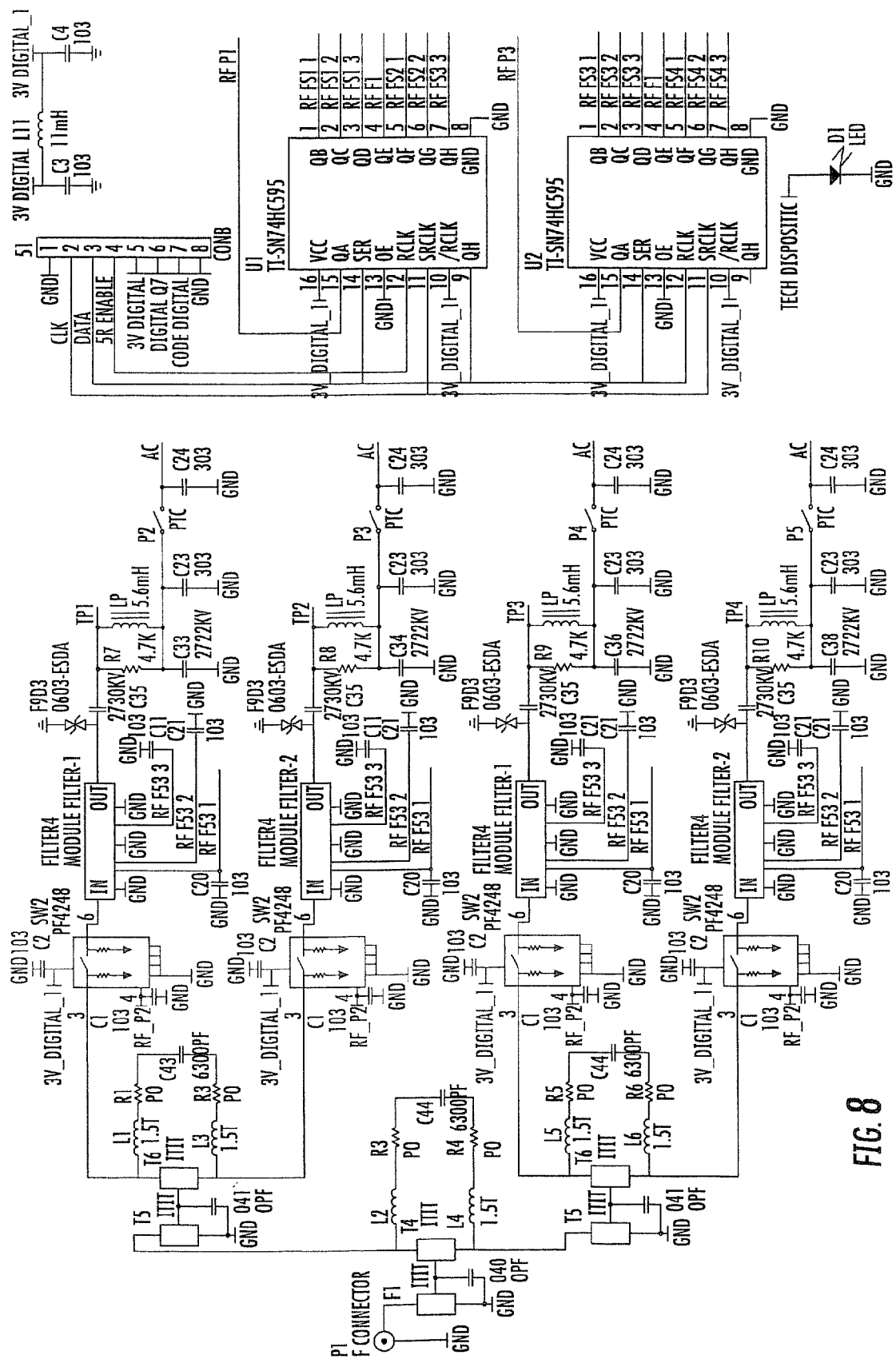
FIG. 8 is a schematic diagram of an assembly board that includes a plurality of the plug-in filter circuits of FIG. 5 as well as a radio frequency splitter and associated switches.

FIG. 8 is a detailed circuit diagram of a circuit board that implements the 1×N radio frequency splitter 124 and the plug-in filter circuits 130-137 of FIG. 3.

Figure 9:
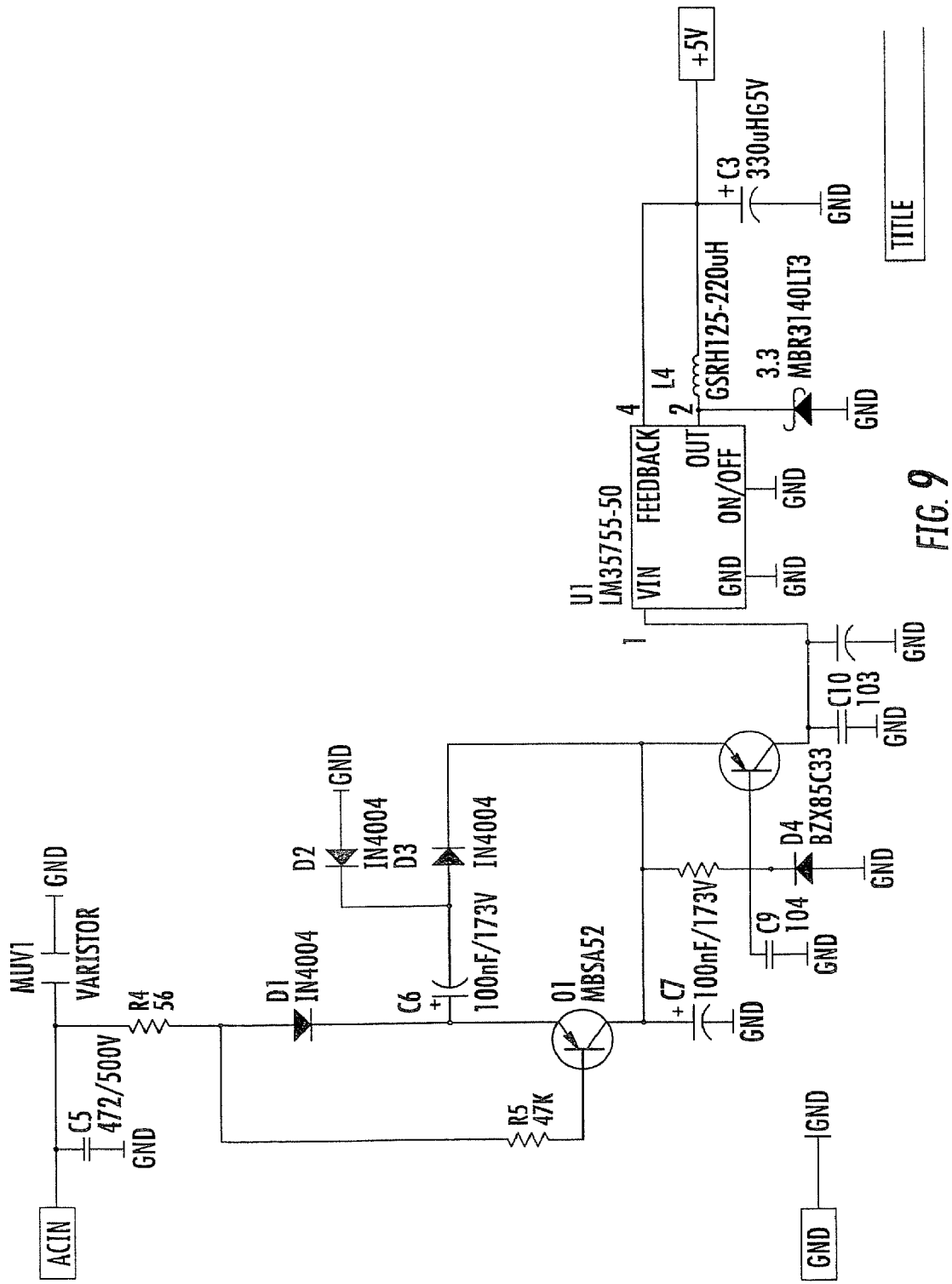
FIG. 9 is a schematic diagram of an embodiment of the power supply of FIG. 3.

FIG. 9 is a schematic diagram of an embodiment of the power supply 170 of FIG. 3. As shown in FIG. 9, the power supply 170 takes an input alternating current signal (AC IN) transforms that input signal into a 5 volt direct current output signal. The power supply 170 includes conventional components that will be well understood by those of skill in the art. It will also be appreciated that numerous other power supplies could be used.

Figure 10:
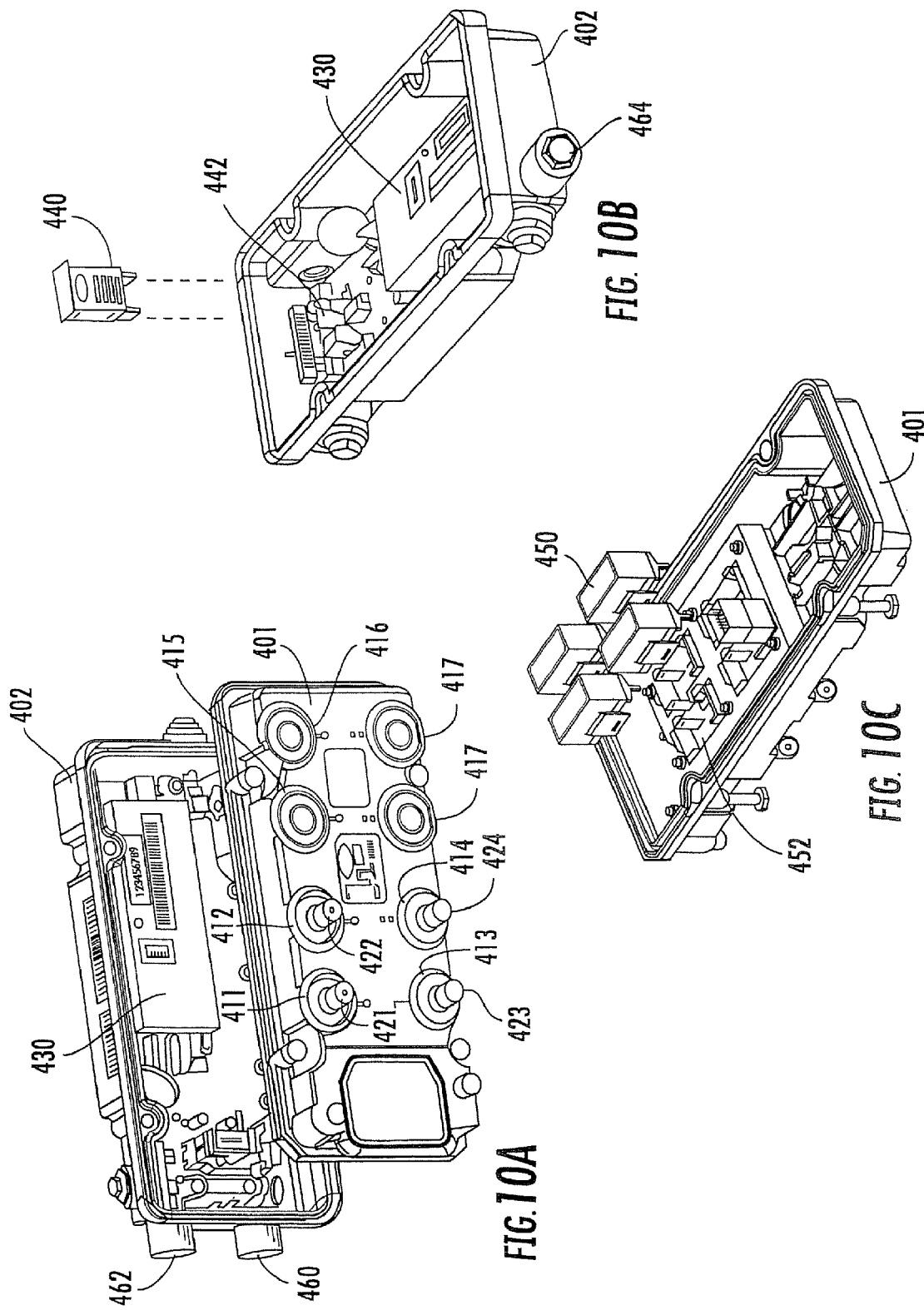
FIG. 10A is an exploded perspective view of an addressable tap unit according to embodiments of the present invention.
FIG. 10B is a perspective view of the housing of the addressable tap unit of FIG. 10A showing how the plug-in directional coupler can be plugged into the unit.
FIG. 10C is a perspective view of the faceplate of the addressable tap unit of FIG. 10A showing how the plug-in filter circuit can be plugged into the faceplate.

FIG. 10A is an exploded perspective view of an addressable tap unit 400 according to certain embodiments of the present invention. The addressable tap unit 400 may correspond to, for example, addressable tap unit 100 of FIG. 3. The addressable tap unit 40 of FIG. 1 and/or the addressable tap unit 90 of FIG. 2 may, but need not, have similar implementations. FIG. 10B is a perspective view of the housing 402 of the addressable tap unit 400 of FIG. 10A showing how a plug-in directional coupler 440 can be plugged into the housing 402. FIG. 10C is a perspective view of the faceplate 401 of the addressable tap unit 400 of FIG. 10A showing how four plug-in filter circuits 450 can be plugged into the faceplate 401.

As shown in FIGS. 10A-10C, the addressable tap unit 400 includes a faceplate 401 and a housing 402. In some embodiments, the faceplate 401 may be ultrasonically sealed to the housing 402 after the addressable tap unit 400 is assembled at the factory, and hence are not removable in the field. This helps guard against subscribers removing plug-in filter units or otherwise tampering with the addressable tap unit 400 in an effort to receive services without payment after the addressable tap units 400 are installed at or near subscriber locations. In other embodiments, the faceplate 401 may be field removable so that service technicians can service and/or change the configuration of the addressable tap unit 400 in the field. With such field serviceable models, a technician could, for example, insert or remove the plug-in directional coupler 440 or some or all of the plug-in filter circuits 450 in the field, or could replace malfunctioning electronics in the addressable tap unit 400.

As shown in FIGS. 10A-10B, the addressable tap unit 400 includes one input line connection 462 and two output line connections 460, 464. When the addressable tap unit 400 is mounted on a pedestal mount, line connection 462 may act as the input line connection and line connection 460 may act as the output line connection. In contrast, when the addressable tap unit 400 is mounted in an aerial configuration, line connection 464 may act as the output line connection.

Referring again to FIG. 10A, the outside surface of the faceplate 401 includes a total of eight tap outlet locations 411-418. Tap outlet locations 411-414 each include a radio frequency output port 421-424. Tap outlet locations 415-418 do not include a radio frequency outlet port, and hence cannot be used. The radio frequency outlet ports 421-424 may correspond to, for example, radio frequency output ports 102-105 of addressable tap unit 100 of FIG. 3. The radio frequency input (e.g., input port 101 of FIG. 3) may, for example, comprise a coupler that taps signal energy off of a radio frequency path that connects the input line connection 462 and a respective one of the output line connections 460, 464.

As shown in FIG. 10B, the housing 402 also includes a plug-in slot 442 that may receive a plug-in directional coupler 440. In certain embodiments of the present invention, the signal flow direction on radio frequency path that connects the input line connection 462 and a respective one of the output line connections 460, 464 may be reversed by simply reversing the orientation in which the plug-in directional coupler 440 is plugged into the slot 442. Thus, by reversing the orientation of the plug-in directional coupler 440 (i.e., by rotating it 180 degrees), in a pedestal mount configuration line connection 462 may be changed to act as the output line connection and line connection 460 may be changed to act as the input line connection. Likewise, when the addressable tap unit 400 is mounted in an aerial configuration, reversing the orientation of the plug-in directional coupler 440 acts to change line connection 462 to the output line connection, and line connection 464 to the input line connection. The reversible nature of the plug-in directional coupler 440 design allows flexibility in system designs, and can help reduce inventory costs.

As shown in FIGS. 10A-10B, a module 430 is mounted in the housing 402 that contains the FSK receiver, the microprocessor and the power supply. The module 430 may include the power supply 170, the FSK receiver (including the demodulator) 150 and the microprocessor 160. In certain embodiments of the present invention, this module 430 is a field removable and replaceable module. In particular, the module 430 may be mounted in the housing 402 by, for example, a plurality of screws or clips. The module 430 may also include external electrical contacts that mate with other contacts in the housing 402, thereby allowing electrical signals and power to be transferred from the module 430 to other electrical components within the addressable tap unit 400. As the module 430 includes several "active" components, it may be more prone to failure than the other components of the addressable tap unit 400 (which are primarily passive components that simply transfer signals and do not require a power supply). Thus, if one of the active components contained in module 430 fails, the module may be replaced in the field instead of replacing the entire addressable tap unit 400. The modular and replaceable nature of module 430 also facilitates later upgrades to the module. Moreover, if, for example, cost constraints prevent full rollout of addressable tap units having the full capabilities of addressable tap unit 400 or the full capabilities are not needed or desired, the plug-in filter circuits 450, the plug-in directional coupler 440 and the module 430 may be ordered and installed later, since, as discussed above, the non-interruptible contacts 125, 128 allow the addressable tap unit 400 to work (with more limited functionality) even when the plug-in filter circuits 450, the plug-in directional coupler 440 and the module 430 are not installed in the addressable tap unit 400.

As shown in FIG. 10C, the faceplate 401 includes a plurality of recesses 452 that are configured to receive respective of a plurality of plug-in filter circuits 450. In FIGS. 10A-10C, four plug-in filter circuits 450 are provided, one for each radio frequency output port 421-424. As discussed above, each addressable tap in addressable tap unit 400 will work with or without the plug-in filter circuits 450 due to the provision of non-interruptible contacts 128; however, if operated without the plug-in filter circuits 450, the addressable tap unit 400 will exhibit reduced functionality.

The addressable tap units according to embodiments of the present invention may also address an issue that may arise with digital telephone service. Digital telephone service is typically provided over somewhere between a 50 to a 150 MHz frequency band. If a subscriber falls behind in payment, the cable service provider may cut off service to the subscriber. However, in many jurisdictions, laws or ordinances may prevent the cable service provider from cutting off emergency telephone service such as 611 or 911 telephone service. Using an appropriate filter circuit, addressable tap units according to embodiments of the present invention may be provided that have one mode which allows for full digital telephone service, and another mode that filters out most of the digital telephone frequency band while retaining 611 or 911 service. Such addressable tap units may provide a convenient way for cable television service providers to restrict the range of services provided to delinquent customers while complying with applicable laws and reducing the amount of noise in the cable network.

Pursuant to further embodiments of the present invention, the addressable tap units may facilitate identifying the sources of "upstream" noise that is introduced into the cable television network (i.e., noise that is introduced at subscriber ports). When noise is detected on conventional cable television networks, typically a manual effort is made to determine the node where the noise is entering the network. For example, a service technician may be sent out who physically connects and disconnects taps. A network management computer may be used to track how the noise level in the cable television network varies as each tap is turned on and off in order to identify taps that are introducing significant noise into the network. This process may be expensive and time consuming, and may also interrupt service to selected customers.

Pursuant to embodiments of the present invention, however, an operator may use the addressable tap units to, from a remote location, turn each addressable tap associated with the effected node on and off (typically in the upstream direction only). This may be done by a few simple keystrokes or, alternatively, by software that automatically turns individual and/or groups of addressable taps on and off and measures the noise present on the network both before and after the addressable taps are turned off. In this manner, a cable service provider may quickly and efficiently track the noise contribution of individual subscribers, isolate the taps which appear to be the major contributors to the noise introduced onto the network, and/or determine the frequency bands that are the primary contributors to noise inserted into the network from a particular subscriber location. If immediate correction is required, the operator can leave the upstream path to the identified subscriber(s) turned off, thereby reducing or eliminating the noise problem, while maintaining downstream services to these subscribers. The identified subscribers may then be contacted and a convenient time scheduled for a service call where a technician can replace equipment as necessary to rectify the noise problem.

Figure 11:
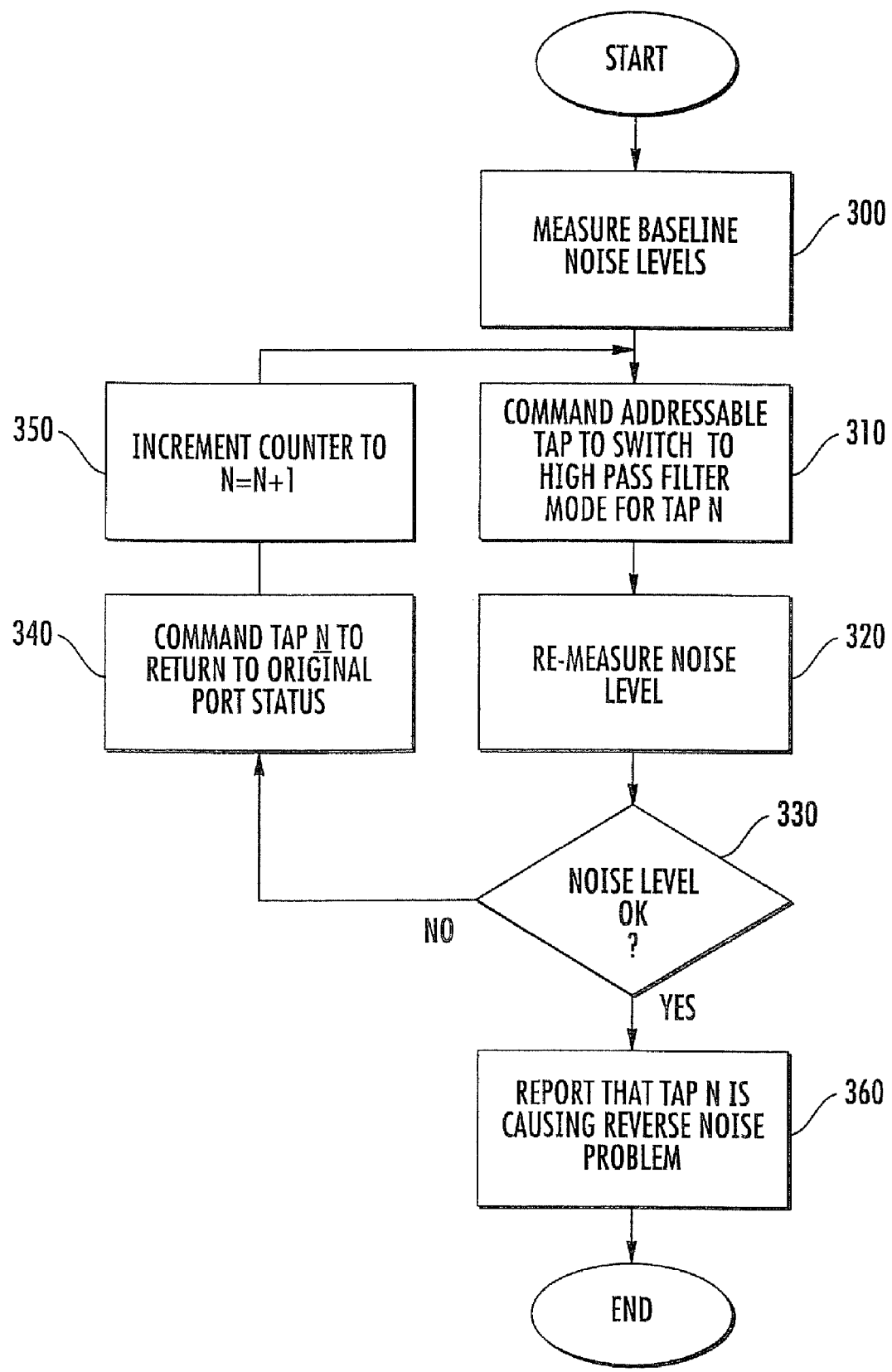
FIG. 11 is a flow chart depicting methods of identifying upstream noise sources in cable television networks according to certain embodiments of the present invention.

FIG. 11 is a flow chart depicting operations for identifying noise sources in cable television networks according to certain embodiments of the present invention. As shown in FIG. 11, operations may begin with measurement of a baseline noise level in the network (block 300). Next, a radio frequency signal is sent to an addressable tap unit that includes a command for the addressable tap unit to reduce the upstream bandwidth between the cable television network and a first of the N addressable taps on the addressable tap unit (block 310). This may be accomplished, for example, by commanding the addressable tap unit to switch the first tap to the high pass mode. Once the addressable tap unit responds to this command, the noise level is then re-measured in order to determine the contribution that the addressable tap unit is making to the overall noise level in the network (block 320).

At block 330 of FIG. 11, a decision is made as to whether or not the re-measured noise level is acceptable. If it is, this indicates that the first of the N taps on the addressable tap unit was the cause of the reverse noise problem. Accordingly, a report or alert may be issued identifying the first of the N taps on the addressable tap unit as the cause of the reverse noise problem, and operations then end. If, on the other hand, at decision block 330 it is determined that the re-measured noise level still remains unacceptable, then operations continue with a command to the addressable tap unit to return the first tap to its original status (block 340). Next, a counter is incremented and operations continue at block 310 so that the operations are repeated on the remaining N−1 taps on the addressable tap unit (block 350). It will be appreciated that in other embodiments of the present invention, the above described operations may be performed on all of the taps of an addressable tap unit as a group (or sub-combinations thereof).

As discussed above, control software may be resident on a control computer such as network management computer 70 and/or billing office computer 80 in FIG. 1. In some embodiments of the present invention, this control software may comprise a user-friendly, web-based software program that includes a series of intuitive screens and menus through which an operator can adjust, from a central location, the bands of frequencies that are passed between the cable network and individual subscribers. FIGS. 12A-12E are screen shots of exemplary screens of one particular embodiment of the control software 80. As discussed above, the control software may be part of, or linked to, for example, billing software, so that changes input into the billing software may automatically result in reconfiguration of addressable taps.

Figure 12A:
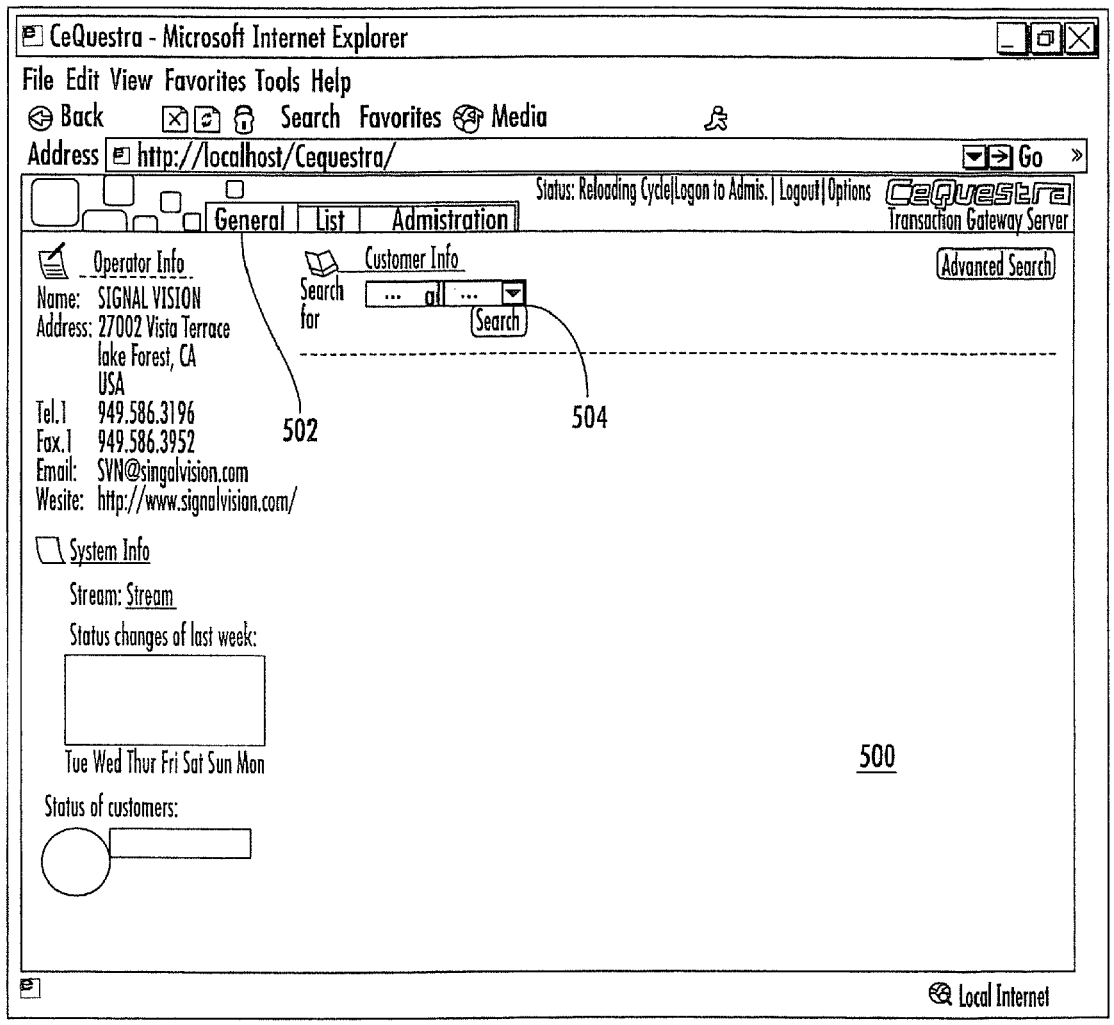
Figure 12B:
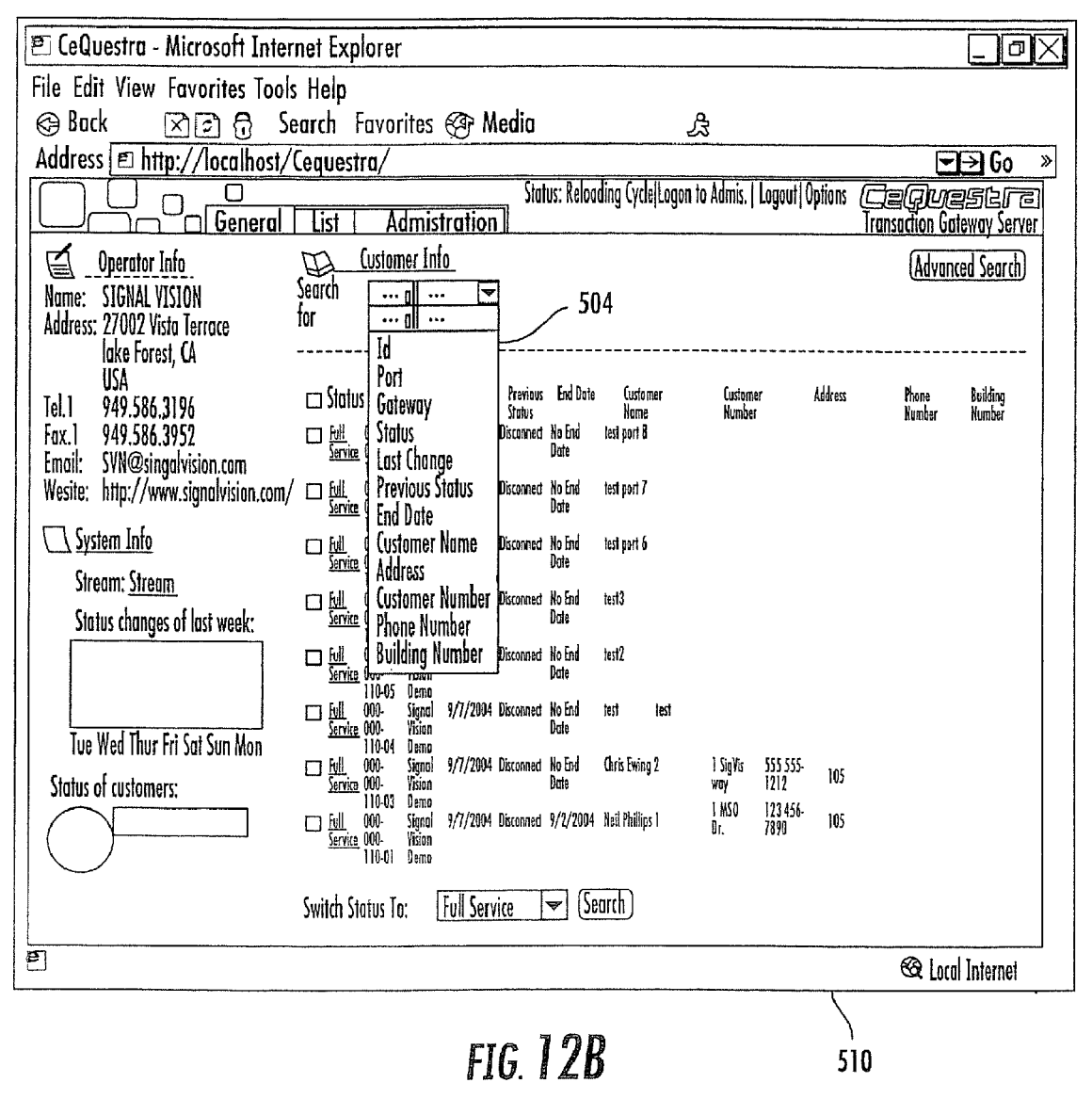
Figure 12C:
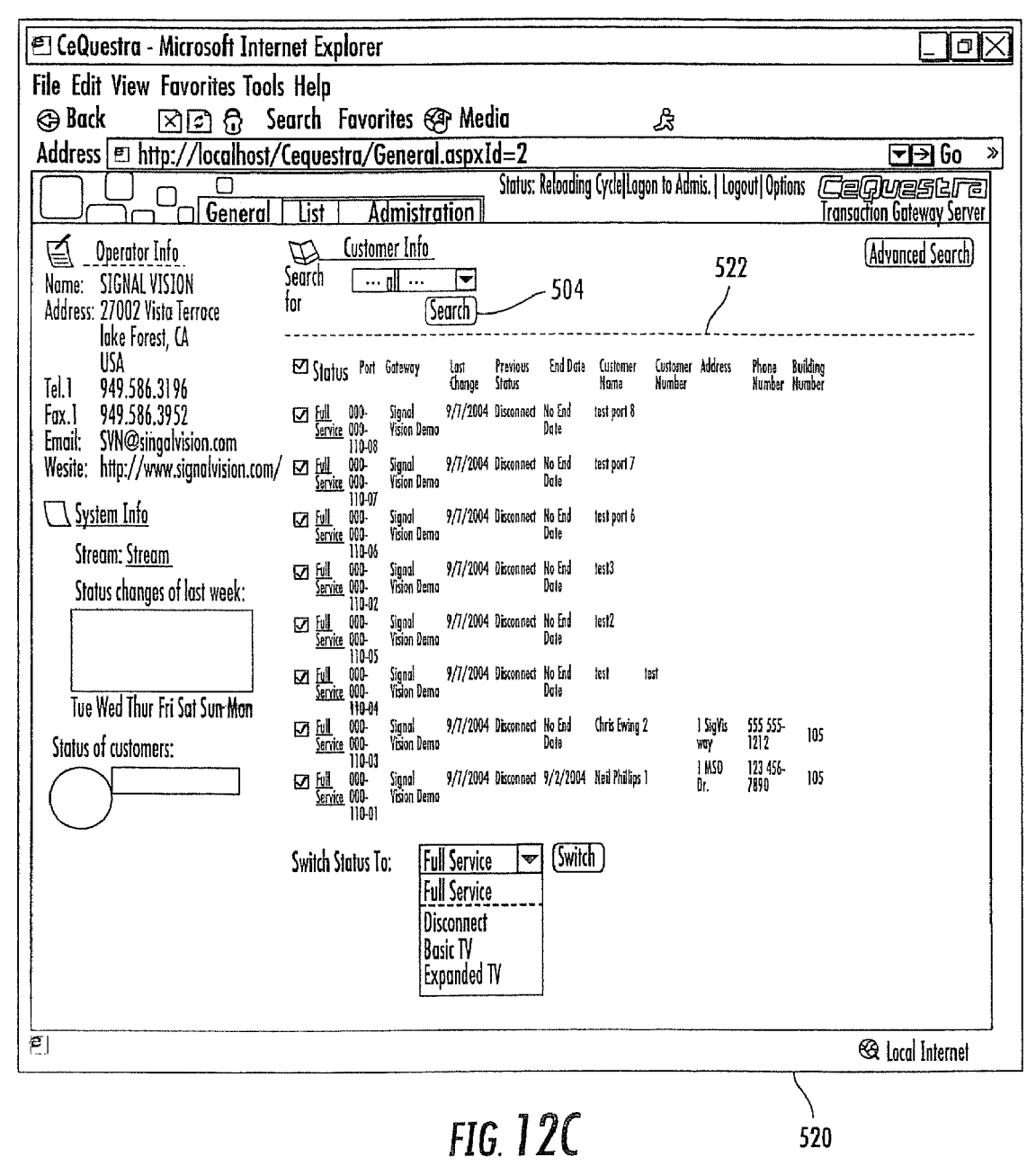

FIG. 12A is a screen shot of the "home page" 500 that an operator first views when executing the control software. The software uses tabs 502 (General, List and Administration) and drop down menus such as a "Search" menu 504. FIG. 12B is a screen shot of a search result screen 510 that illustrates how the Search menu 504 may be used to search for subscribers based on a variety of different parameters such as customer number, address, name, etc. The software will find all of the subscribers that meet the entered search criteria. FIG. 12C is a screen shot of a search results screen 520 that illustrates how the control software allows an operator to control multiple subscribers simultaneously. In particular, once a search has been performed, all or a portion of the search results (i.e., subscribers) 522 may be selected and the software allows the operator to then change the status of the selected subscribers as a group. The control software may also allow multiple subscribers to be pre-identified as a group (for example, all of the rooms in a hotel might be pre-identified as a group so that service changes ordered by the hotel may be implemented for the entire hotel with just a few keystrokes).

Figure 12D:
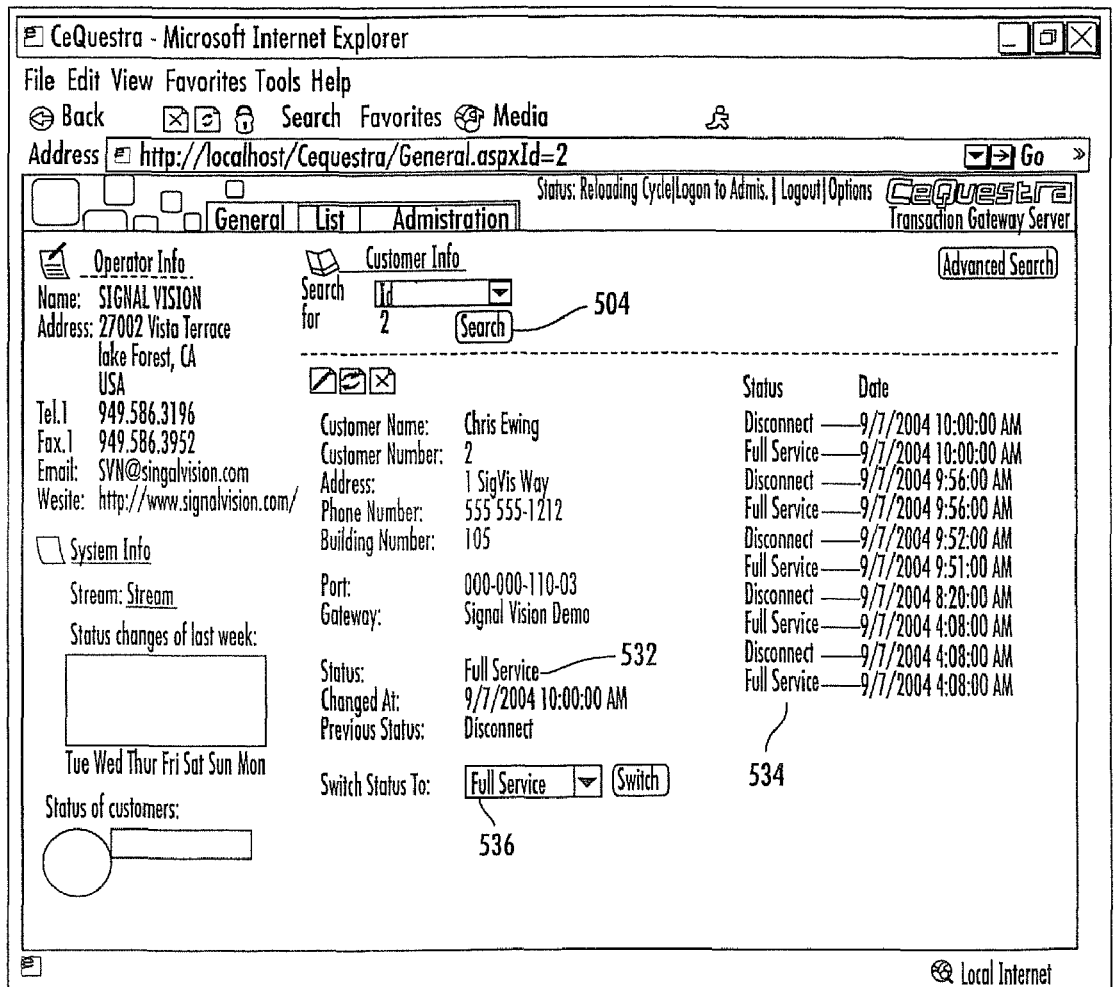
Figure 12E:
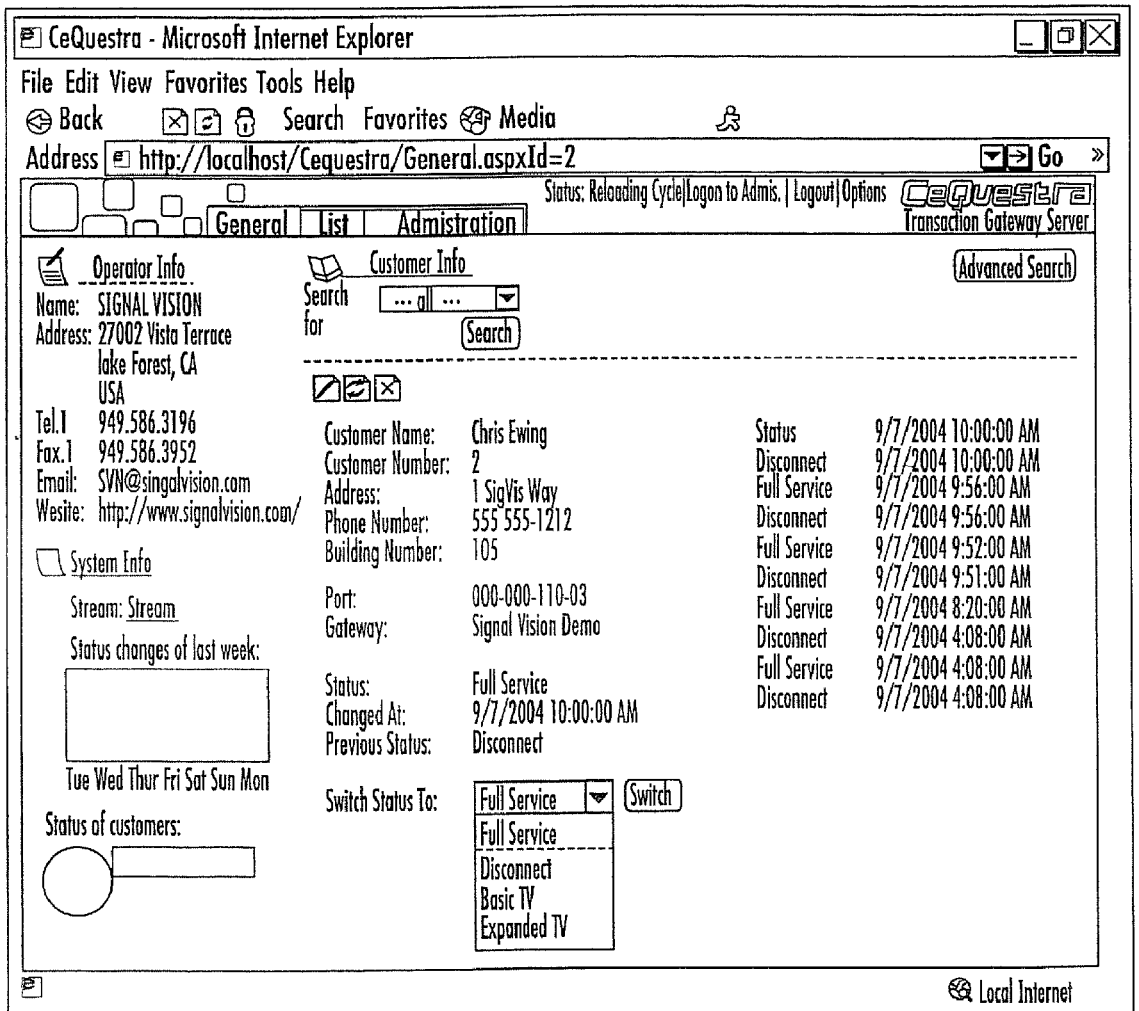

FIG. 12D is a screen shot of a standard subscriber screen 530 which would be displayed in response to a search for a particular subscriber. The screen includes status information 532 on the current services that are being provided to the subscriber (here "Full Service"), as well as information 534 regarding the subscriber's service history. The screen includes a drop-down menu 536 next to the heading "Switch Status To" which the operator may use to reprogram, from a remote location, the addressable tap at or near the subscriber's physical location to provide a different level of services to the subscriber. In particular, as shown in FIG. 12E, which is a screen shot 540 that shows the drop-down menu 536 displayed, by simply clicking on the drop-down menu 536, a listing of each different service option is provided. Here, the cable system operator only provides a limited set of service options, namely Basic TV, Expanded TV, Full Service and Disconnect (i.e., no service). By selecting the desired service option with, for example, a pointing device and then activating the "Switch" button the service provided to the subscriber may easily be changed from a remote location.

Some embodiments of the addressable tap units disclosed herein may include a bypass switch that allows the addressable taps on the unit to continue to operate even when the faceplate 401 is removed from the housing 402. This bypass switch provides an alternate route for both power and radio frequency signals. Provision of the bypass switch allows downstream subscribers to continue to receive service even when the faceplate 401 of the addressable tap unit 400 has been removed for servicing of the addressable tap unit. By keeping service in place, it may be possible to reduce the number of complaints and/or service calls that are received by the cable service provider.

In some embodiments of the present invention, the addressable tap unit may include a local interface port that allows a service technician to monitor the status of each addressable tap on the unit locally by connecting, for example, a laptop computer to the interface port and running a software program that monitors tap status and output. In certain embodiments of the present invention, the interface port may comprise a Local Craft Serial Interface Port that connects to a 9-pin serial interface.

In some embodiments of the present invention, the plug-in directional coupler, such as plug-in directional coupler 440 of FIG. 10B, determines the value of the tap. Typically, the plug-in directional coupler is factory installed, but it can readily be replaced in the field if different tap values are necessary. In addition, the plug-in directional coupler may include both a directional coupler and a broadband equalizer. The broadband equalizer may increase the loss levels at lower frequencies. This additional low frequency loss may force a greater percentage of the cable networks auto-leveling home communications terminals (e.g., cable modems and set-top boxes) to transmit their reverse radio frequency signals at higher frequencies, where performance may be improved. As the directional coupler (with or without broadband equalizer) may be a plug-in piece of hardware, the tap value, equalizer value and/or signal direction may be easily changed by removing and replacing the plug-in directional coupler with a different directional coupler.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An addressable tap unit for a cable television network, comprising:
   a radio frequency input that is configured to connect to the cable television network;
   a radio frequency receiver that is configured to receive a radio frequency signal input at the radio frequency input;
   a radio frequency output that is configured to be coupled to a first subscriber premise; and
   a plug-in filter circuit that is removably coupled between the radio frequency input and the radio frequency output, the plug-in filter circuit including a plurality of signal paths and a first filter that is on a first of the plurality of signal paths that filters out signals in one or more frequency bands;
   a plurality of switches that are configured to select one of the plurality of signal paths through the plug-in filter circuit, wherein the plurality of switches are controlled in response to data contained in the radio frequency signal; and
   an alternate radio frequency signal path between the radio frequency input and the radio frequency output that bypasses the plug-in filter circuit,
   wherein the addressable tap unit is configured so that signals incident at the radio frequency input traverse the alternate radio frequency signal path if the plug-in filter circuit is not installed in the addressable tap unit.

2. The addressable tap unit of claim 1, wherein the plug-in filter circuit further includes a second filter that is on a second of the plurality of signal paths, wherein the second filter comprises a high pass filter that passes signals in at least part of the downstream frequency band between the cable television network and the first subscriber premise while attenuating signals in the full upstream frequency band between the first subscriber premise and the cable television network, wherein the plurality of switches are configured to select one and only one of the plurality of signal paths through the plug-in filter circuit.

3. The addressable tap unit of claim 1, wherein the plurality of switches are part of the plug-in filter circuit.

4. The addressable tap unit of claim 1, further comprising:
   a radio frequency splitter;
   a plurality of additional radio frequency outputs that are coupled to respective of a plurality of additional subscriber premises; and
   a plurality of additional filter circuits coupled between the radio frequency input and respective ones of the plurality of additional radio frequency outputs; and
   a plurality of sets of switches, wherein each set of switches is associated with a respective one of the plurality of additional filter circuits and is configured to select one of a plurality of signal paths through the respective filter circuit, wherein the switches in each set of switches are controlled in response to data contained in the radio frequency signal.

5. The addressable tap unit of claim 1, further comprising a switch between the plug-in filter circuit and the radio frequency output.

6. The addressable tap unit of claim 2, wherein the first filter comprises a band pass filter.

7. The addressable tap unit of claim 2, wherein the first of the plurality of signal paths through the filter circuit passes signals in the downstream frequency band from the cable television network to the first subscriber premise and blocks signals in at least selected frequency ranges in the upstream frequency band from the first subscriber premise to the cable television network, and wherein a third of the plurality of signal paths through the plug-in filter circuit passes all signals in the downstream frequency band from the cable television network to the first subscriber premise and all signals in the upstream frequency band from the first subscriber premise to the cable television network.

8. The addressable tap unit of claim 2, further comprising a microprocessor that receives an output of the radio frequency receiver that includes the data contained in the radio frequency signal, wherein the microprocessor is configured to generate a plurality of control signals that control the settings of at least some of the plurality of switches based at least in part on the data contained in the radio frequency signal.

9. The addressable tap unit of claim 2, wherein the first filter passes selected portions of the upstream frequency band from the first subscriber premise to the cable television network while blocking other portions of the upstream frequency band from the first subscriber premise to the cable television network.

10. The addressable tap unit of claim 2, wherein one of the plurality of signal paths disconnects the radio frequency input from the radio frequency output.

11. An addressable tap unit for a cable television network, comprising:
a radio frequency input;
a radio frequency output that is coupled to a first subscriber premise;
a plug-in filter circuit coupled between the radio frequency input and the radio frequency output, the plug-in filter circuit including a plurality of switches that select one of a plurality of signal paths through the plug-in filter circuit; and
an alternate radio frequency path that bypasses the plug-in filter circuit, wherein the addressable tap unit is configured so that signals incident at the radio frequency input traverse the alternate radio frequency path if the plug-in filter circuit is not installed in the addressable tap unit.

12. The addressable tap unit of claim 11, further comprising a radio frequency receiver that is configured to receive a radio frequency signal input at the radio frequency input, wherein the plurality of switches are controlled in response to data contained in the radio frequency signal.

13. The addressable tap unit of claim 11, wherein the plurality of signal paths through the filter circuit include a first signal path that includes a first filter that filters out signals in a first frequency band, a second signal path that includes a second filter that filters out signals in a second frequency band, and a third signal path that passes signals in both the first and second frequency bands.

14. The addressable tap unit of claim 11, further comprising a switch between the plug-in filter circuit and the radio frequency output.

15. The addressable tap unit of claim 12, further comprising a microprocessor that receives an output of the radio frequency receiver that includes the data contained in the radio frequency signal, wherein the microprocessor is configured to generate a plurality of control signals that control the settings of at least some of the plurality of switches based at least in part on the data contained in the radio frequency signal.

16. The addressable tap unit of claim 15, further comprising a power supply, wherein the power supply, the microprocessor and the radio frequency receiver comprise a field installable and field removable module.

17. The addressable tap unit of claim 13, wherein the first filter comprises a high pass filter and wherein the second filter comprises a band pass filter.

18. A method of identifying upstream noise sources in a cable television network, the method comprising:
(a) sending a first control signal to an addressable tap unit that is connected to the cable television network, the addressable tap unit including a radio frequency input, a radio frequency output that is coupled to a first subscriber premise, a filter circuit that is coupled between the radio frequency input and the radio frequency output that has a plurality of signal paths including at least a first signal path that includes a first filter and a second signal path that includes a second filter, and a plurality of switches that select between the plurality of signal paths, wherein the first control signal is used to select one of the plurality of signal paths based on services that are to be provided to the first subscriber premise;
(b) measuring a baseline noise level in the network;
(c) sending a second control signal to the addressable tap unit, wherein the second control signal is used to select another of the plurality of signal paths to reduce the upstream bandwidth between the cable television network and the radio frequency output that is coupled to the first subscriber premise; and
(d) measuring a noise level in the cable television network after the upstream bandwidth between the cable television network and the radio frequency output that is coupled to the first subscriber premise has been reduced.

19. The method of claim 18, further comprising:
repeating operations (c) and (d) for additional ones of a plurality of radio frequency outputs on the addressable tap unit, and
identifying at least one radio frequency output the addressable tap unit that the measurements indicate are introducing more than a predetermined amount of noise into the cable television network.

20. The method of claim 19, wherein the signal path selected by the second control signal comprises a signal path that includes a high pass filter.

21. An addressable tap unit for a cable television network, comprising:
a control signal receiver that is configured to receive a plurality of filter selection control signals for the addressable tap unit from the cable television network;
a plug-in filter circuit that includes a plurality of filters, a respective one of which is configured to selectively attenuate a respective portion of a cable television network band; and
a switching unit that is configured to select different ones of the plurality of filters in response to the receipt of one of the plurality of filter selection control signals from the cable television network;
an on-off switch between the plug-in filter circuit and a radio frequency output; and
an alternate radio frequency signal path that bypasses the plug-in filter circuit,
wherein the addressable tap unit is configured so that signals traverse pass through the plug-in filter circuit when the plug-in filter circuit is installed in the addressable tap unit and traverse the alternate radio frequency signal path when the plug-in filter circuit is not installed in the addressable tap unit.

22. The addressable tap unit of claim 21, further comprising a microprocessor that receives an output of the control signal receiver that includes a respective one of the plurality of filter selection control signals and generates at least one switching unit control signal in response to the respective one of the plurality of filter selection control signals that selects the subset of the plurality of filters selected by the respective one of the plurality of filter selection control signals.

* * * * *